(12) United States Patent
Okuda

(10) Patent No.: US 12,167,595 B2
(45) Date of Patent: Dec. 10, 2024

(54) SEMICONDUCTOR DEVICE AND METHOD OF MANUFACTURING THE SAME

(71) Applicant: Kioxia Corporation, Tokyo (JP)

(72) Inventor: Shinya Okuda, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 403 days.

(21) Appl. No.: 17/682,976

(22) Filed: Feb. 28, 2022

(65) Prior Publication Data

US 2022/0406810 A1 Dec. 22, 2022

(30) Foreign Application Priority Data

Jun. 21, 2021 (JP) .................. 2021-102722

(51) Int. Cl.
| | |
|---|---|
| *H10B 43/00* | (2023.01) |
| *H10B 41/10* | (2023.01) |
| *H10B 41/20* | (2023.01) |
| *H10B 43/10* | (2023.01) |
| *H10B 43/20* | (2023.01) |
| *H10B 43/27* | (2023.01) |
| *H10B 43/50* | (2023.01) |

(52) U.S. Cl.
CPC .............. *H10B 43/20* (2023.02); *H10B 41/10* (2023.02); *H10B 41/20* (2023.02); *H10B 43/10* (2023.02); *H10B 43/27* (2023.02); *H10B 43/50* (2023.02)

(58) Field of Classification Search
CPC ........ H10B 43/20; H10B 43/27; H10B 43/10; H10B 43/30; H10B 43/40; H10B 43/50
See application file for complete search history.

(56) References Cited

U.S. PATENT DOCUMENTS

| | | | |
|---|---|---|---|
| 10,438,966 B2* | 10/2019 | Shioda | ................. H01L 29/7827 |
| 2011/0212569 A1 | 9/2011 | Yamazaki et al. | |
| 2020/0286876 A1 | 9/2020 | Nakaki | |
| 2021/0082753 A1 | 3/2021 | Wakatsuki et al. | |

FOREIGN PATENT DOCUMENTS

| | | |
|---|---|---|
| CN | 111653573 A | 9/2020 |
| JP | 2011-199272 A | 10/2011 |
| TW | 202111783 A | 3/2021 |

* cited by examiner

*Primary Examiner* — Reema Patel
(74) *Attorney, Agent, or Firm* — Foley & Lardner LLP

(57) ABSTRACT

A semiconductor device includes a stacked film including a plurality of electrode layers and a plurality of insulating layers alternately stacked in a first direction and a columnar portion including a charge storage layer and a first semiconductor layer and extending in the first direction in the stacked film. The device further includes a second semiconductor layer provided on the stacked film and the columnar portion, and at least a part of regions in the second semiconductor layer contains phosphorus having an atomic concentration of $1.0 \times 10^{21}/cm^3$ or more and hydrogen having an atomic concentration of $1.0 \times 10^{19}/cm^3$ or less.

11 Claims, 18 Drawing Sheets

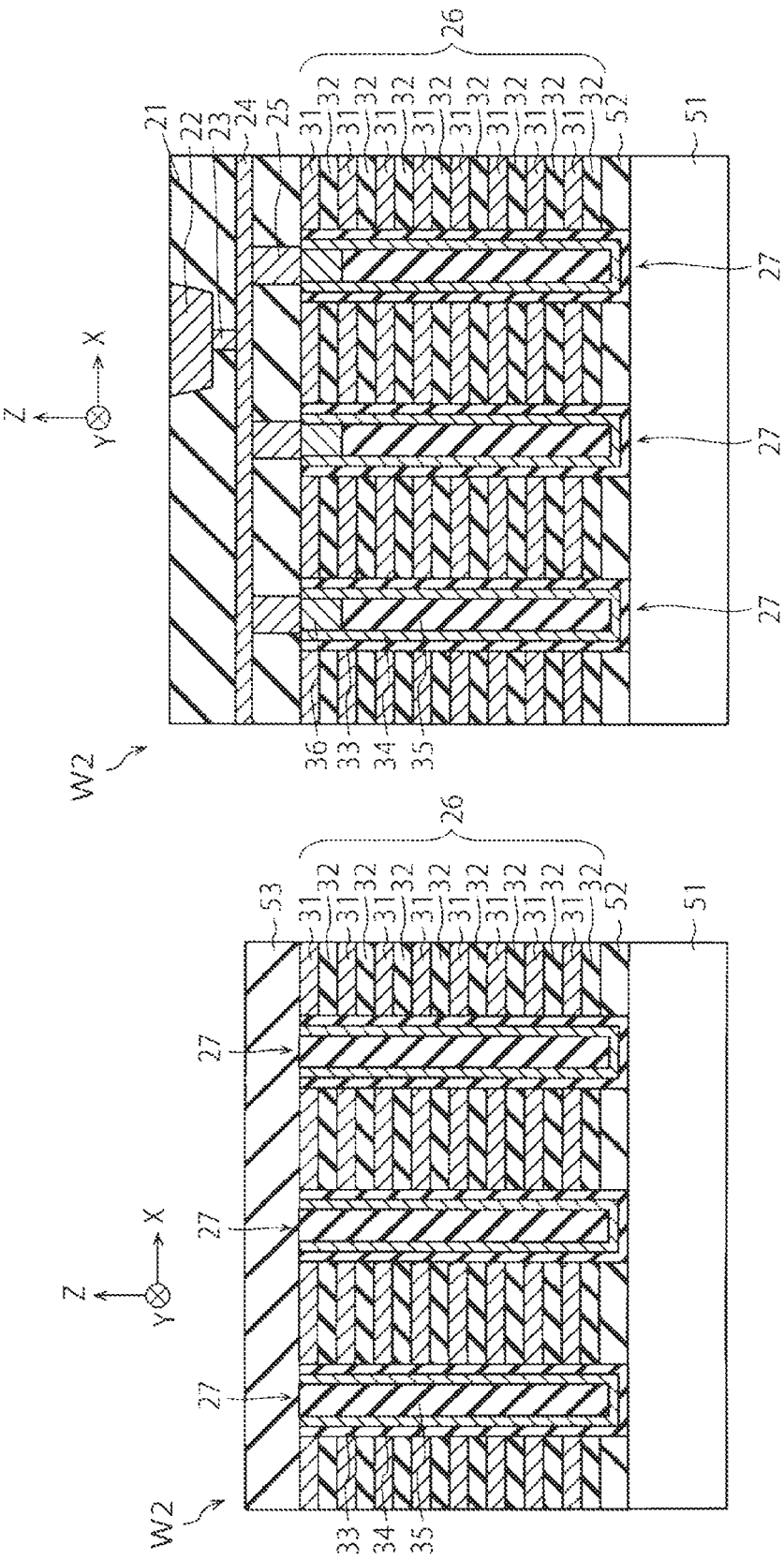

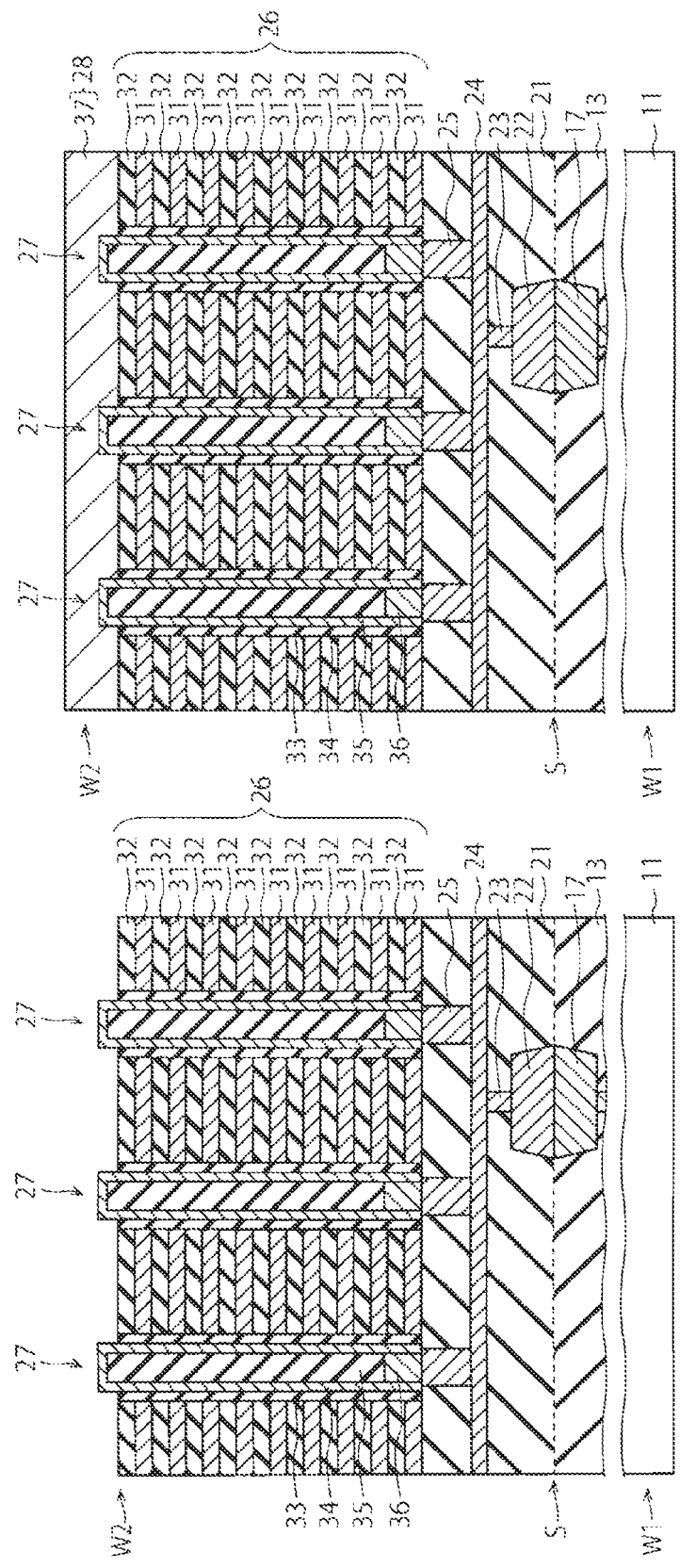

SEMICONDUCTOR DEVICE AND METHOD OF MANUFACTURING THE SAME

CROSS-REFERENCE TO RELATED APPLICATION(S)

This application is based upon and claims the benefit of priority from Japanese Patent Application No. 2021-102722, filed Jun. 21, 2021, the entire contents of which are incorporated herein by reference.

FIELD

Embodiments described herein relate generally to a semiconductor device and a method of manufacturing the same.

BACKGROUND

When a semiconductor layer of a semiconductor device contains hydrogen, it is often desirable to lower the atomic concentration of hydrogen in the semiconductor layer.

DESCRIPTION OF THE DRAWINGS

FIGS. 5A and 5B are cross-sectional views (2/5) illustrating the method of manufacturing the semiconductor device according to the first embodiment.

FIGS. 7A and 7B are cross-sectional views (4/5) illustrating the method of manufacturing the semiconductor device according to the first embodiment.

DETAILED DESCRIPTION

Figure 1:
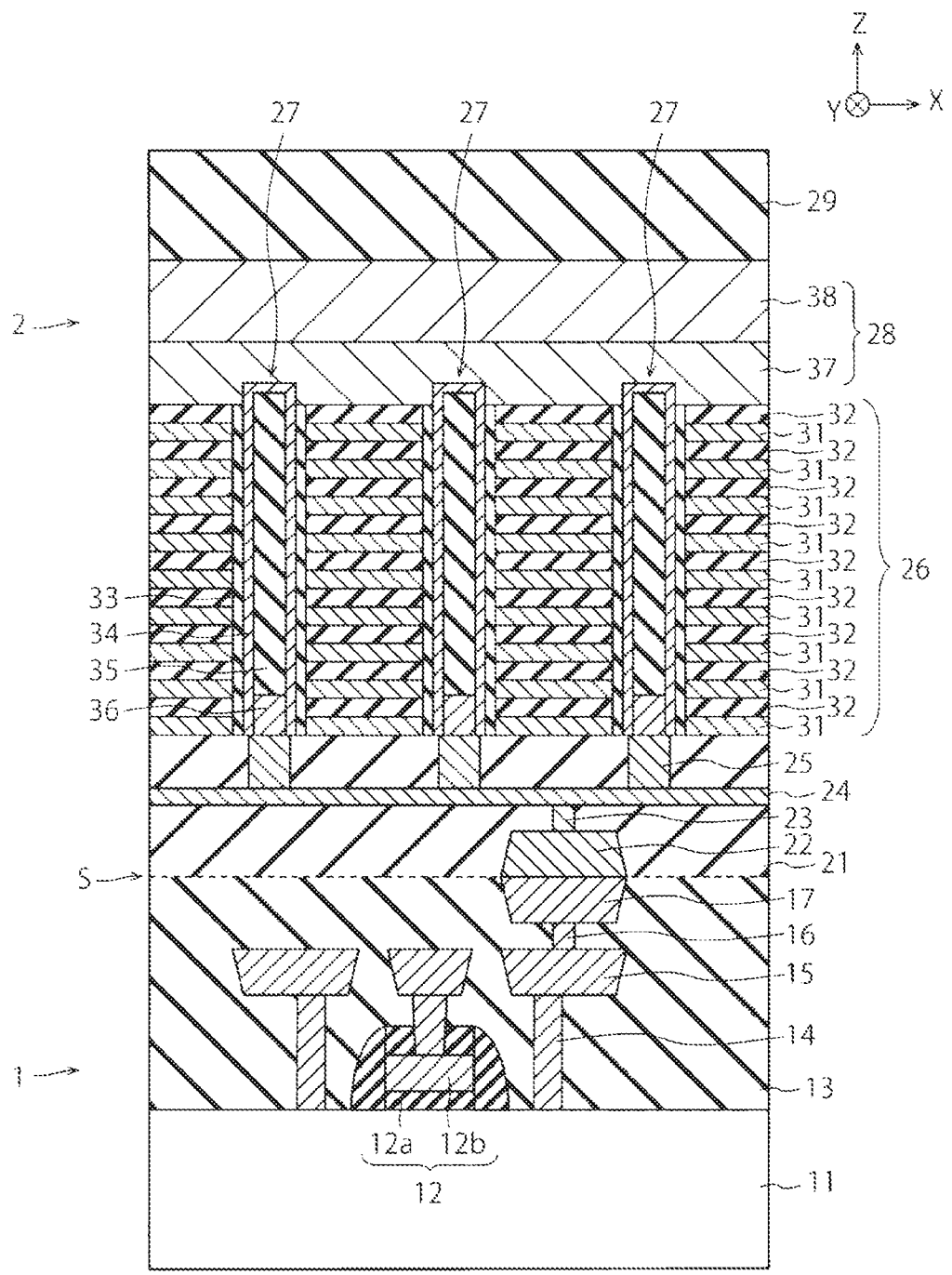
FIG. 1 is a cross-sectional view illustrating a structure of a semiconductor device according to a first embodiment.

At least one embodiment provides a semiconductor device and a method of manufacturing the same which may lower the atomic concentration of hydrogen in a semiconductor layer.

In general, according to at least one embodiment, a semiconductor device includes a stacked film including a plurality of electrode layers and a plurality of insulating layers alternately stacked in a first direction and a columnar portion including a charge storage layer and a first semiconductor layer and extending in the first direction in the stacked film. The device further includes a second semiconductor layer provided on the stacked film and the columnar portion, and at least a part of regions in the second semiconductor layer contains phosphorus having an atomic concentration of $1.0 \times 10^{21}/cm^3$ or more and hydrogen having an atomic concentration of $1.0 \times 10^{19}/cm^3$ or less.

Hereinafter, embodiments of the present disclosure will be described with reference to the drawings. In FIGS. 1 to 18, the same reference numerals will be given to the same components, and the redundant descriptions thereof will be omitted.

First Embodiment

FIG. 1 is a cross-sectional view illustrating the overall structure of a semiconductor device according to a first embodiment. The semiconductor device of FIG. 1 is, for example, a three-dimensional flash memory.

The semiconductor device of FIG. 1 includes a circuit region 1 including a complementary metal oxide semiconductor (CMOS) circuit and an array region 2 including a memory cell array. The memory cell array includes a plurality of memory cells which store data, and the CMOS circuit includes a peripheral circuit which controls an operation of the memory cell array. The semiconductor device of FIG. 1 is manufactured, for example, by bonding a circuit wafer including the circuit region 1 to an array wafer including the array region 2 as will be described later. The reference letter S denotes a bonding surface between the circuit region 1 and the array region 2.

FIG. 1 illustrates the X direction, the Y direction, and the Z direction which are perpendicular to each other. In this specification, the +Z direction is handled as the upward direction, and the −Z direction is handled as the downward direction. For example, since the circuit region 1 is illustrated in the −Z direction of the array region 2, it is located below the array region 2. The −Z direction may coincide with the direction of gravity, or may not coincide with the direction of gravity. The Z direction is an example of a first direction.

In FIG. 1, the circuit region 1 includes a substrate 11, a transistor 12, an interlayer insulating film 13, a plurality of contact plugs 14, a wiring layer 15 including a plurality of wirings, a via plug 16, and a metal pad 17. FIG. 1 illustrates three of the plurality of wirings in the wiring layer 15 and three contact plugs 14 provided below these wirings. The substrate 11 is an example of a first substrate. The metal pad 17 is an example of a first pad.

In FIG. 1, the array region 2 includes an interlayer insulating film 21, a metal pad 22, a via plug 23, a wiring layer 24 including a plurality of wirings, a plurality of contact plugs 25, a stacked film 26, a plurality of columnar portions 27, a source layer 28, and an insulating film 29. FIG. 1 illustrates one of the plurality of wirings in the wiring layer 24, three contact plugs 25 provided on this wiring, and three columnar portions 27. The metal pad 22 is an example of a second pad.

Further, the stacked film 26 includes a plurality of electrode layers 31 and a plurality of insulating layers 32. Each columnar portion 27 includes a memory insulating film 33, a channel semiconductor layer 34, a core insulating film 35, and a core semiconductor layer 36. The source layer 28 includes a semiconductor layer 37 and a metal layer 38. The channel semiconductor layer 34 is an example of a first semiconductor layer. The semiconductor layer 37 is an example of a second semiconductor layer.

Hereinafter, a structure of the semiconductor device of at least one embodiment will be described with reference to FIG. 1.

The substrate 11 is, for example, a semiconductor substrate such as a silicon (Si) substrate. The transistor 12 is provided on the substrate 11, and includes a gate insulating film 12a and a gate electrode 12b. The transistor 12 constitutes, for example, the above-mentioned CMOS circuit. The interlayer insulating film 13 is formed on the substrate 11 so as to cover the transistor 12. The interlayer insulating film 13 is, for example, a silicon oxide ($SiO_2$) film, or a stacked film including a $SiO_2$ film and another insulating film.

The contact plugs 14, the wiring layer 15, the via plug 16, and the metal pad 17 are formed in the interlayer insulating film 13. Specifically, the contact plugs 14 are disposed on the substrate 11 or on the gate electrode 12b of the transistor 12. In FIG. 1, the contact plug 14 on the substrate 11 is provided on a source region and a drain region (not illustrated) of the transistor 12. The wiring layer 15 is disposed on this contact plug 14. The via plug 16 is disposed on the wiring layer 15. The metal pad 17 is disposed on the via plug 16 above the substrate 11. The metal pad 17 is, for example, a copper (Cu) layer.

The interlayer insulating film 21 is formed on the interlayer insulating film 13. The interlayer insulating film 21 is, for example, a $SiO_2$ film, or a stacked film including a $SiO_2$ film and another insulating film.

The metal pad 22, the via plug 23, the wiring layer 24, and the contact plugs 25 are formed in the interlayer insulating film 21. Specifically, the metal pad 22 is disposed on the metal pad 17 above the substrate 11. The metal pad 22 is, for example, a Cu layer. The via plug 23 is disposed on the metal pad 22. The wiring layer 24 is disposed on the via plug 23. FIG. 1 illustrates one of the plurality of wirings in the wiring layer 24, and this wiring functions as, for example, a bit line. The contact plugs 25 are disposed on the wiring layer 24.

The stacked film 26 is provided on the interlayer insulating film 21, and includes the plurality of electrode layers 31 and the plurality of insulating layers 32 alternately stacked in the Z direction. The electrode layer 31 is, for example, a metal layer including a tungsten (W) layer, and functions as a word line. The insulating layer 32 is, for example, a $SiO_2$ film. In at least one embodiment, the plurality of electrode layers 31 have the same thickness, and the plurality of insulating layers 32 have the same thickness. However, the thickness of the uppermost insulating layer 32 among these insulating layers 32 may be greater than the thickness of the other insulating layers 32.

Each columnar portion 27 is provided in the stacked film 26, and includes the memory insulating film 33, the channel semiconductor layer 34, the core insulating film 35, and the core semiconductor layer 36. The memory insulating film 33 is formed on the side surface of the stacked film 26, and has a tubular shape extending in the Z direction. The channel semiconductor layer 34 is formed on the side surface of the memory insulating film 33, and has a tubular shape extending in the Z direction. The core insulating film 35 and the core semiconductor layer 36 are formed on the side surface of the channel semiconductor layer 34, and have a rod shape extending in the Z direction. Specifically, the core semiconductor layer 36 is disposed on the contact plug 25, and the core insulating film 35 is disposed on the core semiconductor layer 36.

The memory insulating film 33 includes, for example, a block insulating film, a charge storage layer, and a tunnel insulating film in this order, as will be described later. The block insulating film is, for example, a $SiO_2$ film. The charge storage layer is, for example, a silicon nitride (SiN) film. The tunnel insulating film is, for example, a $SiO_2$ film or a silicon oxynitride film (SiON film). The channel semiconductor layer 34 is, for example, a polycrystalline semiconductor layer such as a polysilicon layer. The core insulating film 35 is, for example, a $SiO_2$ film. The core semiconductor layer 36 is, for example, a polycrystalline semiconductor layer such as a polysilicon layer. Each memory cell in the above-mentioned memory cell array is configured with, e.g., the channel semiconductor layer 34, the charge storage layer, and the electrode layer 31.

The channel semiconductor layer 34 in each columnar portion 27 is provided at a position higher than the metal pad 22, but is electrically connected to the metal pad 22 via the core semiconductor layer 36, the contact plug 25, the wiring layer 24, and the via plug 23. Thus, the memory cell array in the array region 2 is electrically connected to the peripheral circuit in the circuit region 1 via the metal pad 22 or the metal pad 17. This makes it possible to control an operation of the memory cell array by the peripheral circuit.

The source layer 28 includes the semiconductor layer 37 and the metal layer 38 formed in this order on the stacked film 26 and the columnar portion 27, and functions as a source line. In at least one embodiment, the channel semiconductor layer 34 of each columnar portion 27 is exposed from the memory insulating film 33, and the semiconductor layer 37 is formed directly on the channel semiconductor layer 34. Further, the metal layer 38 is formed directly on the semiconductor layer 37. Thus, the source layer 28 is electrically connected to the channel semiconductor layer 34 of each columnar portion 27. The semiconductor layer 37 is, for example, a polycrystalline semiconductor layer such as a polysilicon layer. The metal layer 38 includes, for example, a W layer, a Cu layer, or an aluminum (Al) layer.

The insulating film 29 is formed on the source layer 28. The insulating film 29 is, for example, a $SiO_2$ film.

Here, impurity atoms included in the semiconductor device of at least one embodiment will be described.

The semiconductor layer 37 of at least one embodiment contains phosphorus (P) atoms and hydrogen (H) atoms as impurity atoms. In at least one embodiment, the concentration of P atoms in the semiconductor layer 37 is $1.0 \times 10^{21}/cm^3$ or more, and the concentration of H atoms in the semiconductor layer 37 is $1.0 \times 10^{19}/cm^3$ or less. The reason why the semiconductor layer 37 of at least one embodiment contains impurity atoms as described above will be described later.

Further, the condition that the concentration of P atoms is $1.0\times10^{21}/cm^3$ or more and the concentration of H atoms is $1.0\times10^{19}/cm^3$ or less may be satisfied in the entire region in the semiconductor layer 37, or may be established only in a part of regions in the semiconductor layer 37. In the latter case, the semiconductor layer 37 may include a polycrystalline region composed of a polycrystalline semiconductor layer such as a polysilicon layer and an amorphous region composed of an amorphous semiconductor layer such as an amorphous silicon layer, and the above condition may be established only in the polycrystalline region in the semiconductor layer 37. Meanwhile, the concentration of H atoms in the amorphous region may be higher than $1.0\times10^{19}/cm^3$. Further details of such a concentration distribution will be described later.

The P atom concentration of $1.0\times10^{21}/cm^3$ indicates that the number of P atoms per 1 $cm^3$ is $1.0\times10^{21}$ atoms. Similarly, the H atom concentration of $1.0\times10^{19}/cm^3$ indicates that the number of H atoms per 1 $cm^3$ is $1.0\times10^{19}$ atoms.

Figure 2:
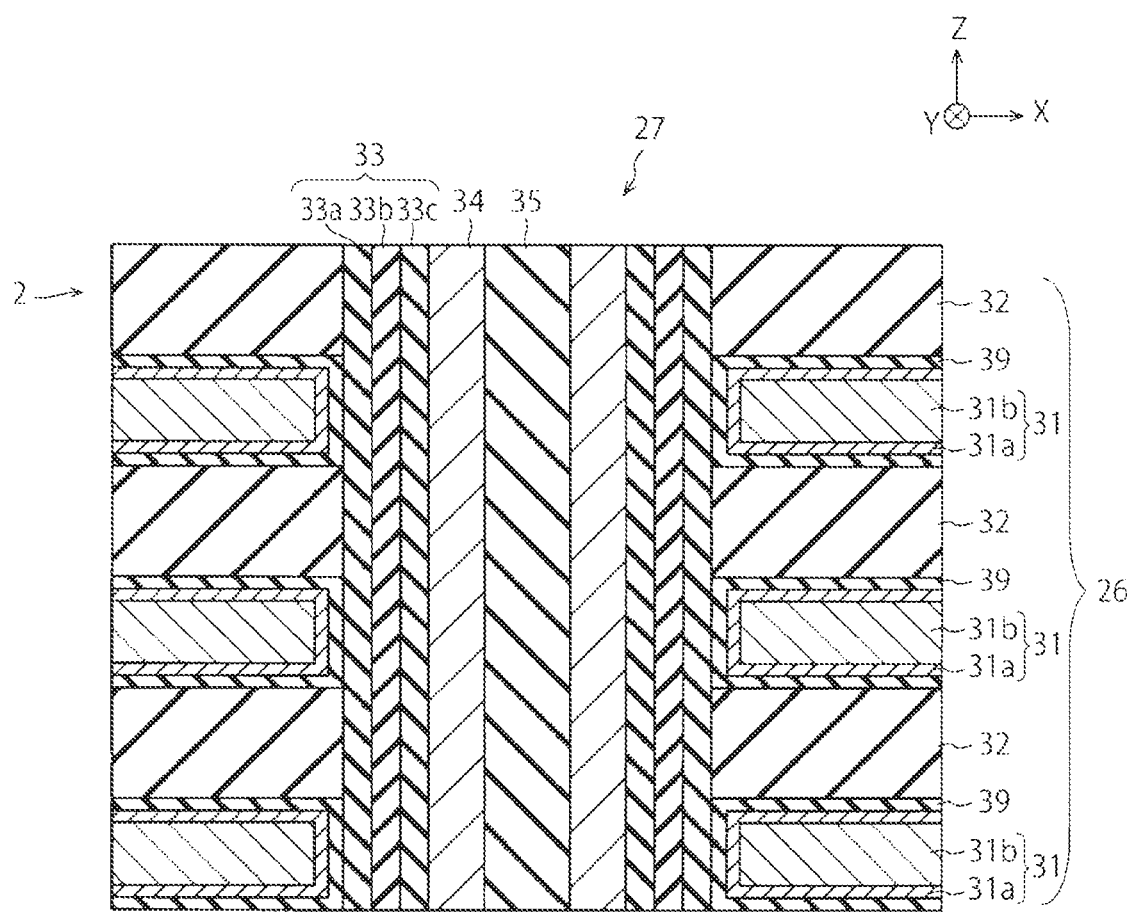
FIG. 2 is an enlarged cross-sectional view illustrating the structure of the semiconductor device according to the first embodiment.

FIG. 2 is an enlarged cross-sectional view illustrating the structure of the semiconductor device according to the first embodiment.

FIG. 2 illustrates three electrode layers 31 and three insulating layers 32 provided in the stacked film 26 and one columnar portion 27 provided in the stacked film 26. As described above, the memory insulating film 33 in the columnar portion 27 includes a block insulating film 33a, a charge storage layer 33b, and a tunnel insulating film 33c formed on the side surface of the stacked film 26 in this order. The block insulating film 33a is, for example, a $SiO_2$ film. The charge storage layer 33b is, for example, a SiN film. The tunnel insulating film 33c is, for example, a $SiO_2$ film or a SiON film.

Meanwhile, each electrode layer 31 includes a barrier metal layer 31a and an electrode material layer 31b. The barrier metal layer 31a is, for example, a titanium nitride film (TiN film). The electrode material layer 31b is, for example, a W layer. As illustrated in FIG. 2, each electrode layer 31 of the present embodiment is formed on the lower surface of the upper insulating layer 32, the upper surface of the lower insulating layer 32, and the side surface of the block insulating film 33a via a block insulating film 39. The block insulating film 39 is, for example, an aluminum oxide film ($Al_2O_3$ film), and functions as a block insulating film of each memory cell together with the block insulating film 33a. As described above, the stacked film 26 of at least one embodiment includes the block insulating film 39 in addition to the electrode layer 31 and the insulating layer 32. The block insulating film 39, the barrier metal layer 31a, and the electrode material layer 31b are formed in this order on the lower surface of the upper insulating layer 32, the upper surface of the lower insulating layer 32, and the side surface of the block insulating film 33a.

Figure 3:
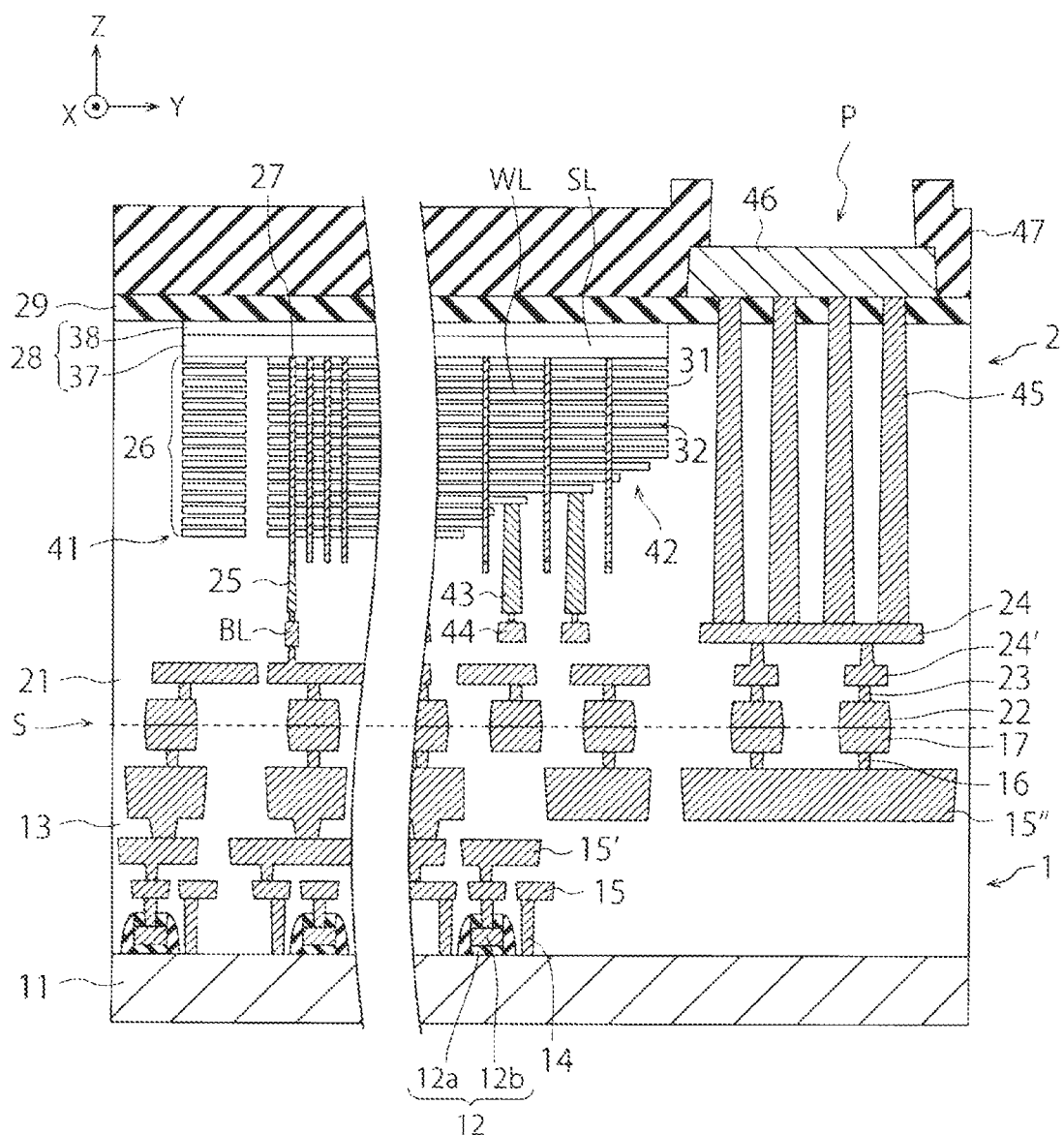
FIG. 3 is a cross-sectional view illustrating the overall structure of the semiconductor device according to the first embodiment.

FIG. 3 is a cross-sectional view illustrating the overall structure of the semiconductor device according to the first embodiment.

As illustrated in FIG. 3, the circuit region 1 includes the substrate 11, a plurality of transistors 12, the interlayer insulating film 13, the plurality of contact plugs 14, the wiring layer 15 including the plurality of wirings, a plurality of via plugs 16, and a plurality of metal pads 17. Details of these components in the circuit region 1 are as described with reference to FIG. 1.

As illustrated in FIG. 3, the circuit region 1 further includes a wiring layer 15' including a plurality of wirings and a wiring layer 15" including a plurality of wirings. In FIG. 3, the wiring layer 15' is provided on the wiring layer 15, the wiring layer 15" is provided on the wiring layer 15', and the via plugs 16 are provided on the wiring layer 15". Although the circuit region 1 includes three wiring layers 15, 15' and 15" in FIG. 3, the number of wiring layers in the circuit region 1 may be other than three.

As illustrated in FIG. 3, the array region 2 includes the interlayer insulating film 21, a plurality of metal pads 22, a plurality of via plugs 23, the wiring layer 24 including the plurality of wirings, the contact plug 25, the stacked film 26, the plurality of columnar portions 27, the source layer 28, and the insulating film 29. FIG. 3 illustrates one contact plug 25 among the plurality of contact plugs 25. The stacked film 26 includes the plurality of electrode layers 31 and the plurality of insulating layers 32. Although not illustrated, each columnar portion 27 includes the memory insulating film 33, the channel semiconductor layer 34, the core insulating film 35, and the core semiconductor layer 36 (see FIG. 1). The source layer 28 includes the semiconductor layer 37 and the metal layer 38. Details of these components in the array region 2 are as described with reference to FIG. 1.

As illustrated in FIG. 3, the array region 2 further includes a wiring layer 24' including a plurality of wirings. In FIG. 3, the wiring layer 24' is provided on the via plugs 23, and the wiring layer 24 is provided on the wiring layer 24'. Although the array region 2 includes two wiring layers 24 and 24' in FIG. 3, the number of wiring layers in the array region 2 may be other than two.

The array region 2 further includes a memory cell array provided below the insulating film 29 in the interlayer insulating film 21. The memory cell array 41 includes, e.g., the stacked film 26, the columnar portion 27, and the source layer 28. Each electrode layer 31 in the stacked film 26 functions as a word line WL, and the source layer 28 functions as a source line SL.

The memory cell array 41 includes a step structure 42. Each word line WL is electrically connected to a word wiring layer 44 via a contact plug 43. Meanwhile, each columnar portion 27 is electrically connected to a bit line BL via the contact plug 25, and is electrically connected to the source line SL. The word wiring layer 44 and the bit line BL of at least one embodiment are provided in the wiring layer 24.

The array region 2 further includes a plurality of via plugs 45 provided on the wiring layer 24, a metal pad 46 provided on these via plugs 45 and the insulating film 29, and a passivation film 47 provided on the metal pad 46 and the insulating film 29.

The metal pad 46 is, for example, a Cu layer or an Al layer, and functions as an external connection pad (bonding pad) of the semiconductor device of at least one embodiment. The passivation film 47 is, for example, an insulating film such as a $SiO_2$ film, and has an opening P through which the upper surface of the metal pad 46 is exposed. The metal pad 46 may be electrically connected to a mounting board or any other device through the opening P by means of, e.g., a bonding wire, a solder ball, or a metal bump.

FIGS. 4A to 8B are cross-sectional views illustrating a method of manufacturing the semiconductor device according to the first embodiment.

Figure 4B:
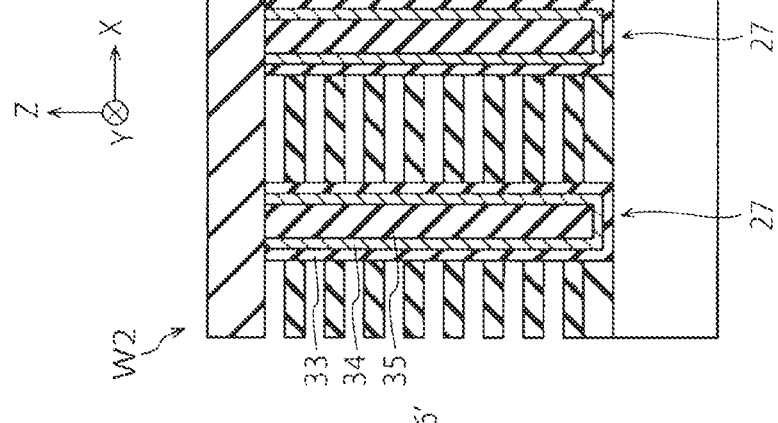
FIGS. 4A and 4B are cross-sectional views (1/5) illustrating a method of manufacturing the semiconductor device according to the first embodiment.
Figure 4A:
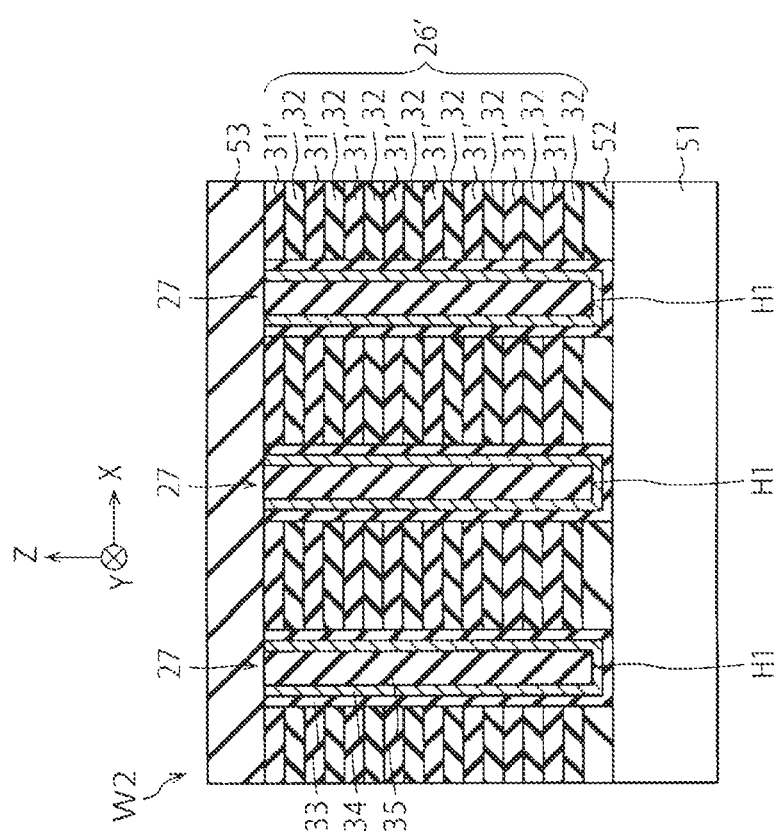

FIG. 4A illustrates an array wafer W2 for manufacturing the array region 2. When manufacturing the array region 2, first, an insulating film 52 is formed on a substrate 51, and a plurality of sacrifice layers 31' and the plurality of insulating layers 32 are alternately formed on the insulating film 52 (FIG. 4A). As a result, a stacked film 26' is formed on the insulating film 52. The stacked film 26' includes the plurality of sacrifice layers 31' and the plurality of insulating layers 32 alternately stacked in the Z direction. The substrate 51 is, for example, a semiconductor substrate such as a Si substrate. The substrate 51 is an example of a second substrate. The insulating film 52 is, for example, a SiN film. The sacrifice layer 31' is, for example, a SiN film.

Next, a plurality of memory holes H1 are formed to penetrate the stacked film 26' and the insulating film 52, and the memory insulating film 33, the channel semiconductor layer 34, and the core insulating film 35 are formed in this order in each memory hole H1 (FIG. 4A). As a result, the plurality of columnar portions 27 are formed in these memory holes H1 to extend in the Z direction. The memory insulating film 33 is formed by forming the block insulating film 33a, the charge storage layer 33b, and the tunnel insulating film 33c in this order in each memory hole H1 (see FIG. 2).

Next, an insulating film 53 is formed on the stacked film 26' and the columnar portions 27 (FIG. 4A). The insulating film 53 is, for example, a $SiO_2$ film.

Next, a slit (not illustrated) is formed to penetrate the insulating film 53 and the stacked film 26', and the sacrifice layers 31' are removed by wet etching using the slit (FIG. 4B). As a result, a plurality of cavities H2 are formed between the insulating layers 32 in the stacked film 26'.

Next, the plurality of electrode layers 31 are formed from the slit in these cavities H2 (FIG. 5A). As a result, the stacked film 26 including the plurality of electrode layers 31 and the plurality of insulating layers 32 alternately stacked in the Z direction is formed between the insulating film 52 and the insulating film 53. Further, a structure in which the plurality of columnar portions 27 penetrate the stacked film 26 is formed above the substrate 51. When forming the electrode layer 31 in each cavity H2, the block insulating film 39, the barrier metal layer 31a, and the electrode material layer 31b are formed in this order in each cavity H2 (see FIG. 2).

Next, the insulating film 53 is removed, a portion of the core insulating film 35 in each columnar portion 27 is removed, and the core semiconductor layer 36 is buried in a region where the portion of the core insulating film 35 is removed (FIG. 5B). As a result, each columnar portion 27 is processed into a structure including the memory insulating film 33, the channel semiconductor layer 34, the core insulating film 35, and the core semiconductor layer 36.

Next, the interlayer insulating film 21, the metal pad 22, the via plug 23, the wiring layer 24, and the plurality of contact plugs 25 are formed on the stacked film 26 and the columnar portions 27 (FIG. 5B). At this time, each of these contact plugs 25 is formed on the core semiconductor layer 36 of the corresponding columnar portion 27, and the wiring layer 24, the via plug 23, and the metal pad 22 are formed on this contact plug 25 in this order.

Figure 6A:
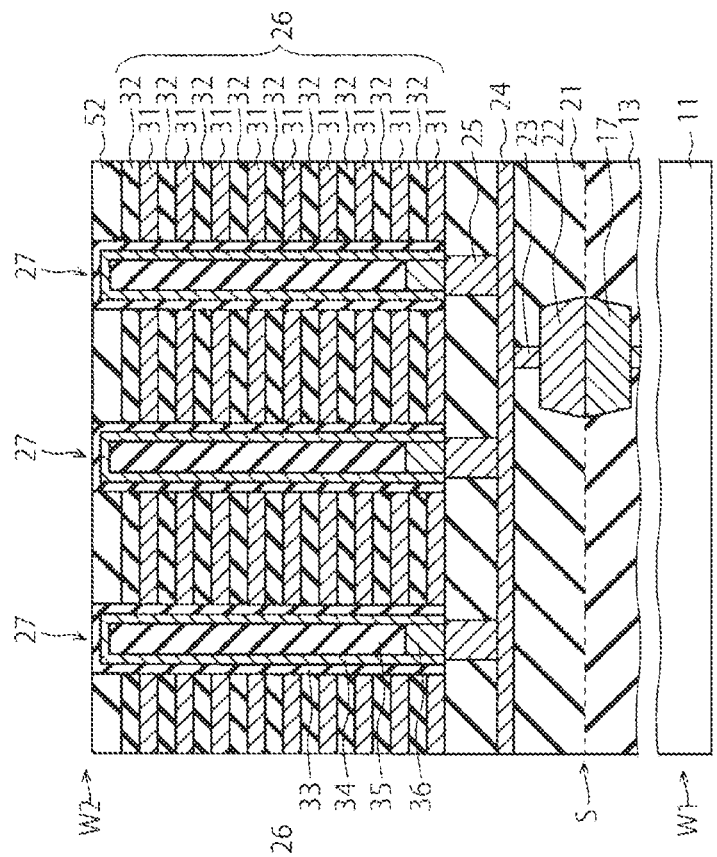
FIGS. 6A and 6B are cross-sectional views (3/5) illustrating the method of manufacturing the semiconductor device according to the first embodiment.

FIG. 6A illustrates a circuit wafer W1 for manufacturing the circuit region 1. The circuit wafer W1 illustrated in FIG. 6A is manufactured by forming the transistor 12, the interlayer insulating film 13, the plurality of contact plugs 14, the wiring layer 15, the via plug 16, and the metal pad 17 on the substrate 11 (see FIG. 1). At this time, the transistor 12 is formed on the substrate 11, and these contact plugs 14 are formed on the substrate 11 or on the transistor 12. Further, the wiring layer 15, the via plug 16, and the metal pad 17 are formed on the contact plug 14 in this order. The substrate 11 is an example of the first substrate.

Next, the direction of the array wafer W2 is inverted, and the circuit wafer W1 and the array wafer W2 are bonded by a mechanical pressure (FIG. 6A). As a result, the interlayer insulating film 13 and the interlayer insulating film 21 are adhered. Next, the circuit wafer W1 and the array wafer W2 are annealed (FIG. 6A). As a result, the metal pad 17 and the metal pad 22 are bonded. In this way, the metal pad 22 on the substrate 51 is bonded to the metal pad 17 on the substrate 11, the interlayer insulating film 21 on the substrate 51 is bonded to the interlayer insulating film 13 on the substrate 11, and the substrate 51 is stacked above the substrate 11.

Figure 6B:
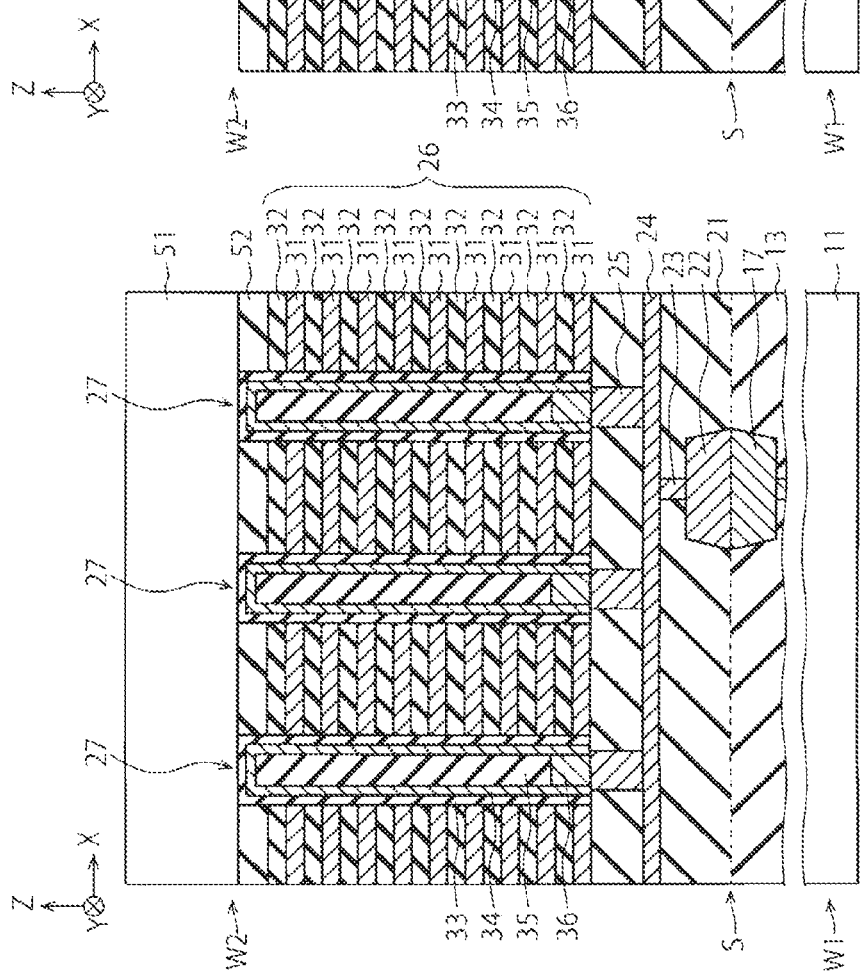

Next, the substrate 51 is removed (FIG. 6B). As a result, the insulating film 52 and each columnar portion 27 are exposed above the substrate 11. The substrate 51 is removed by, for example, chemical mechanical polishing (CMP). In the step of FIG. 6B, not only the substrate 51 may be removed by CMP, but also the substrate 11 may be thinned by CMP.

Next, the insulating film 52 and a portion of the memory insulating film 33 of each columnar portion 27 are removed by etching (FIG. 7A). The portion of the memory insulating film 33 to be removed is, for example, a portion exposed from the stacked film 26. As a result, a portion of the channel semiconductor layer 34 of each columnar portion 27 is exposed from the memory insulating film 33 at a position higher than the stacked film 26.

Next, the semiconductor layer 37 of the source layer 28 is formed on the stacked film 26 and the columnar portions 27 (FIG. 7B). As a result, since the semiconductor layer 37 is formed on the channel semiconductor layer 34 of each columnar portion 27, the semiconductor layer 37 is electrically connected to the channel semiconductor layer 34 of each columnar portion 27.

In the step of FIG. 7B, the semiconductor layer 37 is formed as an amorphous semiconductor layer. This amorphous semiconductor layer is, for example, an amorphous silicon (a-Si) layer. In at least one embodiment, the semiconductor layer 37 as the a-Si layer is formed using, for example, a source gas containing a silicon (Si) element and a hydrogen (H) element. Therefore, the semiconductor layer 37 formed in the step of FIG. 7B contains H atoms as impurity atoms. It is desirable to desorb these H atoms from the semiconductor layer 37.

Accordingly, the semiconductor layer 37 of at least one embodiment is formed as an amorphous semiconductor layer (e.g., an a-Si layer) containing P atoms in addition to H atoms in the step of FIG. 7B. This makes it possible to promote the desorption of H atoms from the semiconductor layer 37, as will be described later. In at least one embodiment, such a semiconductor layer 37 is formed using, for example, a source gas containing a Si element and a H element and a source gas containing a P element and a H element. Examples of these source gases include $SiH_4$ gas and $PH_3$ gas. In the step of FIG. 7B, the semiconductor layer 37 is formed at, for example, 400° C. or lower. This makes it possible to prevent heat at the time of forming the semiconductor layer 37 from exerting a bad influence on the metal pads 17 and 22.

At the stage where the step of FIG. 7B is completed, the concentration of H atoms in the semiconductor layer 37 is higher than, for example, $1.0 \times 10^{19}/cm^3$. A specific example of the concentration of H atoms at this stage is higher than $1.0 \times 10^{19}/cm^3$ and less than or equal to $1.0 \times 10^{20}/cm^3$. In this case, it is desirable to desorb H atoms from the semiconductor layer 37 to reduce the concentration of H atoms in the semiconductor layer 37.

Further, at the stage where the step of FIG. 7B is completed, the concentration of P atoms in the semiconductor layer 37 is lower than, for example, $1.0\times10^{21}/cm^3$. A specific example of the concentration of P atoms at this stage is lower than $1.0\times10^{21}/cm^3$ and greater than or equal to $1.0\times10^{19}/cm^3$. In this case, in order to sufficiently promote the desorption of H atoms from the semiconductor layer 37, it is desirable to increase the concentration of P atoms in the semiconductor layer 37. Here, in at least one embodiment, P atoms are further implanted into the semiconductor layer 37 in a step to be described later.

In the step of FIG. 7B, the concentration of P atoms and the concentration of H atoms in the semiconductor layer 37 may be controlled by adjusting, for example, the ratio of the flow rates between the $SiH_4$ gas and the $PH_3$ gas. In at least one embodiment, the ratio of the flow rate of the $PH_3$ gas to the flow rate of the $SiH_4$ gas is adjusted to, for example, 0.03 or more and 0.35 or less ($0.03 \leq PH_3/SiH_4 \leq 0.35$). This makes it possible to realize the concentration of P atoms and the concentration of H atoms of the above-described specific examples. The flow rate of the $SiH_4$ gas is, for example, 360 sccm. The flow rate of the $PH_3$ gas is, for example, 9 sccm to 126 sccm.

Figure 8A:
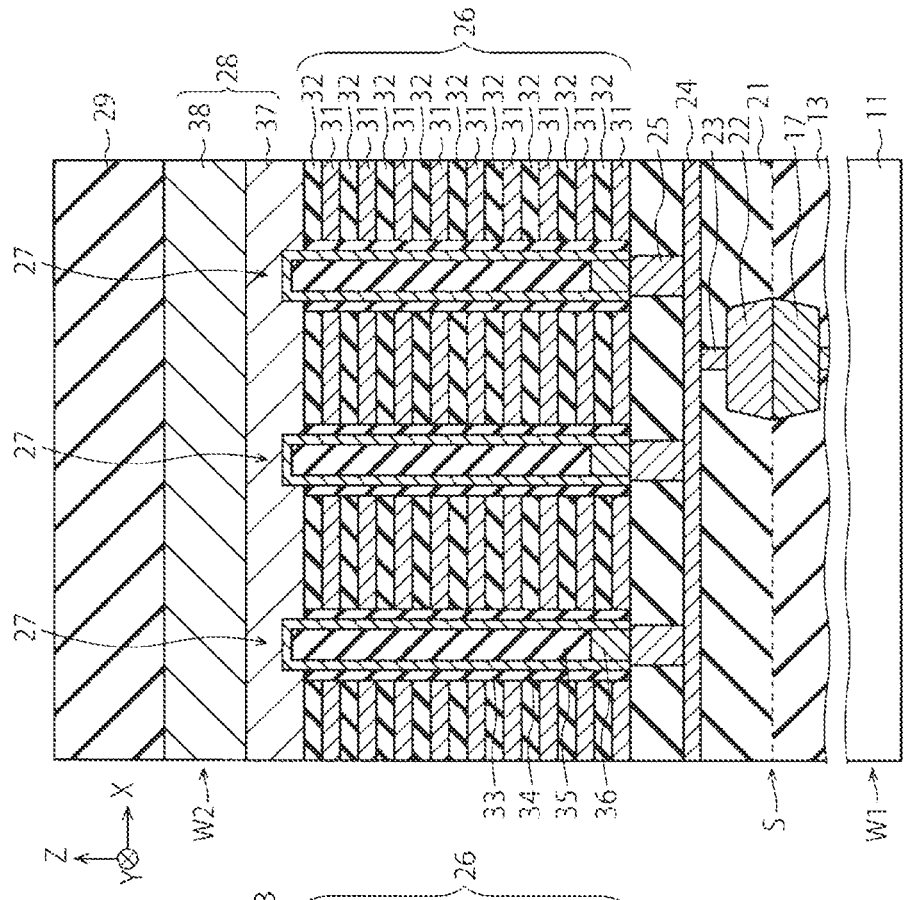
FIGS. 8A and 8B are cross-sectional views (5/5) illustrating the method of manufacturing the semiconductor device according to the first embodiment.

Next, ion implantation into the semiconductor layer 37 is performed using phosphorus (P) ions (FIG. 8A). As a result, P atoms as impurity atoms are further implanted into the semiconductor layer 37. This ion implantation is performed such that the concentration of P atoms in the semiconductor layer 37 is, for example, $1.0\times10^{21}/cm^3$ or more. This makes it possible to sufficiently promote the desorption of H atoms from the semiconductor layer 37 in a step to be described later. In the step of FIG. 8A, the concentration of P atoms in the semiconductor layer 37 may be controlled by adjusting, for example, the duration of ion implantation, power, focal lengths, and flow rates.

Figure 8B:
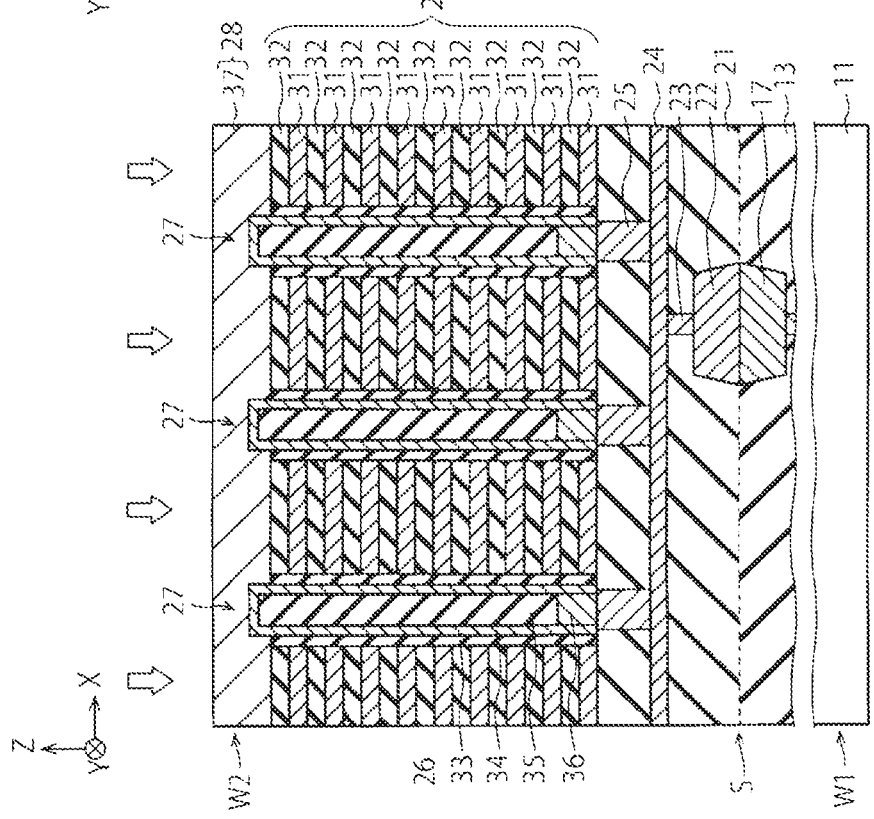

Next, the semiconductor layer 37 is annealed (FIG. 8B). This annealing is, for example, laser annealing. As a result, the semiconductor layer 37 is crystallized, and changes from an amorphous semiconductor layer to a polycrystalline semiconductor layer. The crystallized semiconductor layer 37 is, for example, a polysilicon layer. During this annealing, at least a part of H atoms in the semiconductor layer 37 are desorbed from the semiconductor layer 37, and the concentration of H atoms in the semiconductor layer 37 is lowered. This annealing is performed such that the concentration of H atoms in the semiconductor layer 37 is, for example, $1.0\times10^{19}/cm^3$ or less. According to at least one embodiment, by sufficiently promoting the desorption of H atoms from the semiconductor layer 37 by the high concentration of P atoms, it is possible to reduce the concentration of H atoms as described above.

As described above, in at least one embodiment, in order to desorb H atoms, which are impurity atoms, from the semiconductor layer 37, P atoms, which are separate impurity atoms, are introduced into the semiconductor layer 37. The P atoms are introduced into the semiconductor layer 37 when the semiconductor layer 37 is formed in the step of FIG. 7B and when P ions are implanted into the semiconductor layer 37 in the step of FIG. 8A. In at least one embodiment, these P atoms remain in the final semiconductor layer 37, i.e., in the semiconductor layer 37 of the semiconductor device after manufacture (as a finished product). In the semiconductor device after manufacture, the concentration of P atoms in the semiconductor layer 37 is, for example, $1.0\times10^{21}/cm^3$ or more, and the concentration of H atoms in the semiconductor layer 37 is, for example, $1.0\times10^{19}/cm^3$ or less. Further details of the semiconductor layer 37 of at least one embodiment will be described later.

Next, the metal layer 38 of the source layer 28 is formed on the semiconductor layer 37, and the insulating film 29 is formed on the metal layer 38 (FIG. 8B).

Thereafter, the circuit wafer W1 and the array wafer W2 are cut into a plurality of chips. These chips are cut such that each chip includes the circuit region 1 and the array region 2. In this way, the semiconductor device of FIG. 1 is manufactured.

Figure 9A:
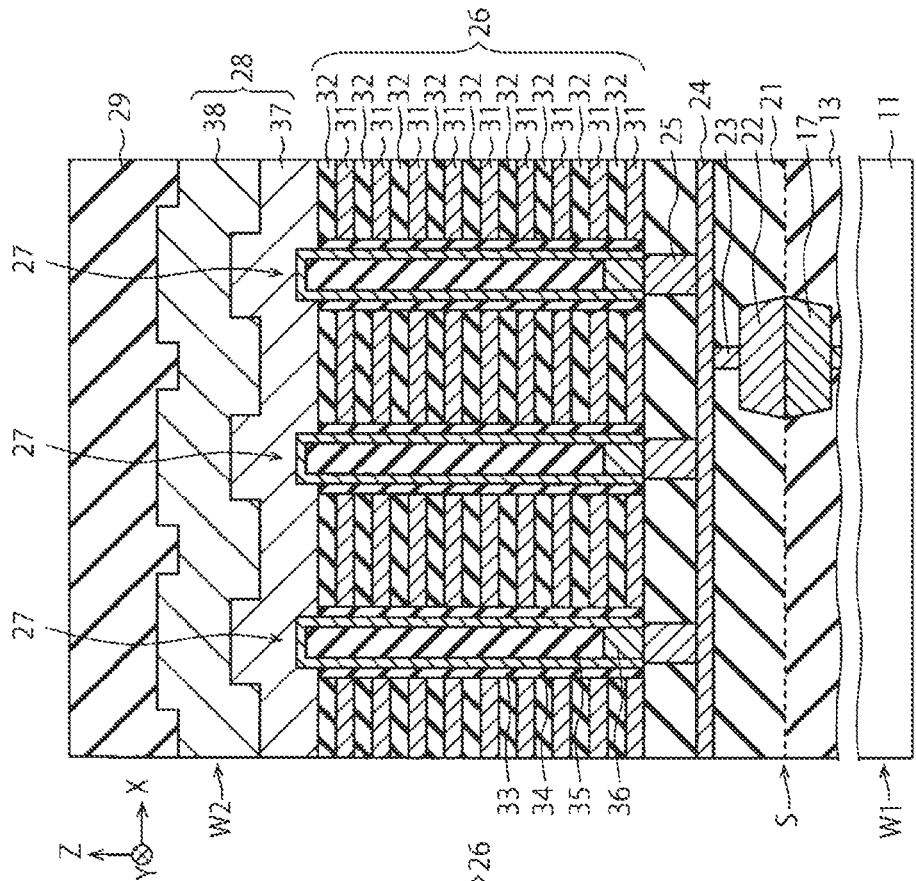
FIGS. 9A and 9B are cross-sectional views illustrating the method of manufacturing the semiconductor device according to a modification of the first embodiment.
Figure 9B:
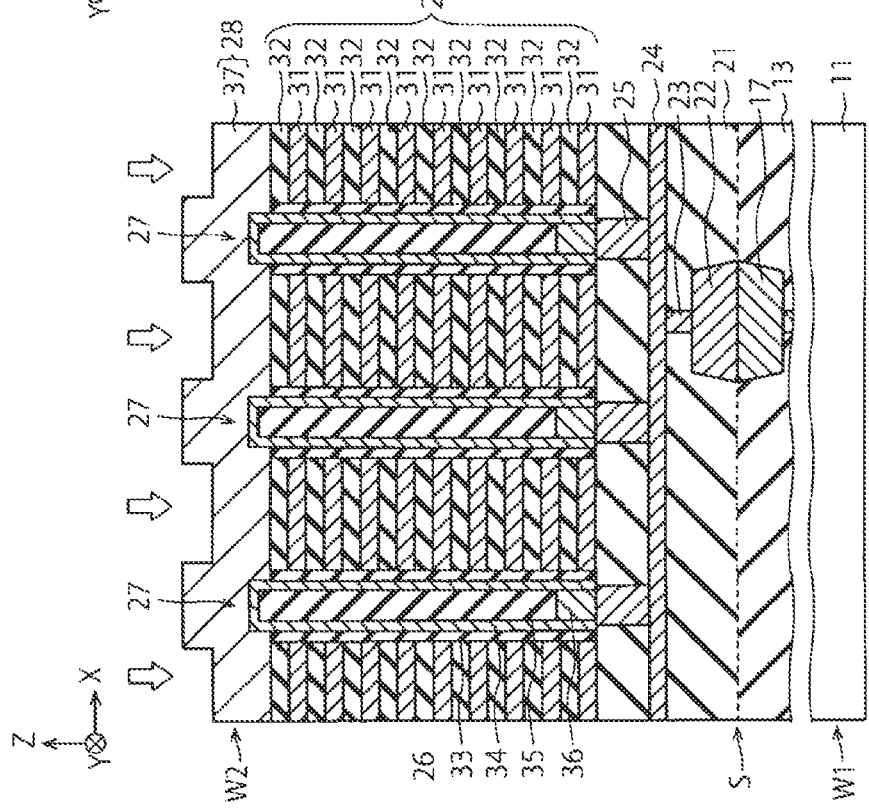

FIGS. 9A and 9B are cross-sectional views illustrating the method of manufacturing the semiconductor device according to a modification of the first embodiment.

The steps of FIGS. 9A and 9B correspond to the steps of FIGS. 8A and 8B, respectively. The semiconductor layer 37 illustrated in FIG. 7B described above may be formed so as to have an upper surface with irregularities due to protrusions of the columnar portions 27. FIG. 9A illustrates the semiconductor layer 37 formed in this way. In this case, ion implantation is performed on this semiconductor layer 37 (FIG. 9A), and annealing is further performed on this semiconductor layer 37 (FIG. 9B). Thereafter, the metal layer 38 is formed on the semiconductor layer 37, the insulating film 29 is formed on the metal layer 38, and the upper surface of the insulating film 29 is planarized by CMP. This CMP may be omitted.

Hereinafter, the semiconductor layer 37 of the first embodiment and the semiconductor layer 37 of a comparative example will be compared with reference to FIGS. 10A to 13B.

Figure 10A:
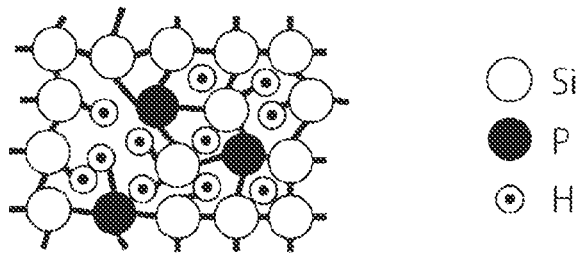
FIGS. 10A to 10C are schematic views illustrating the property of a semiconductor layer according to a comparative example of the first embodiment.
Figure 10B:
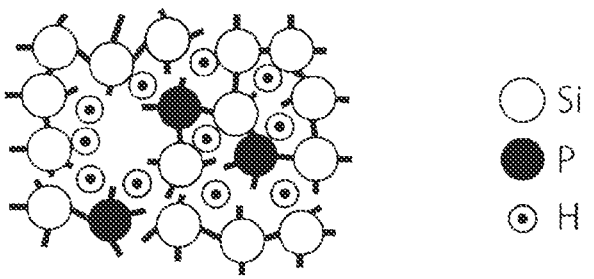
Figure 10C:
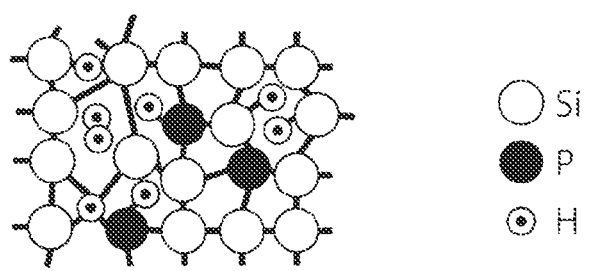

FIGS. 10A to 10C are schematic views illustrating the property of the semiconductor layer 37 according to a comparative example of the first embodiment.

FIG. 10A illustrates Si atoms, P atoms, and H atoms included in the semiconductor layer 37 of this comparative example. Although the semiconductor layer 37 is formed by the step of FIG. 7B in this comparative example, the P ion implantation illustrated in FIG. 8A is not performed on the semiconductor layer 37. Accordingly, the semiconductor layer of this comparative example contains P atoms having a concentration lower than $1.0\times10^{21}/cm^3$ and H atoms having a concentration higher than $1.0\times10^{19}/cm^3$ before the annealing in FIG. 8B. In FIG. 10A, Si atoms form a crystal lattice, and P atoms and H atoms enter the crystal lattice to bond to the Si atoms.

FIG. 10B illustrates the semiconductor layer 37 of this comparative example during the annealing in FIG. 8B. This annealing breaks bonds between Si atoms, P atoms, and H atoms. As a result, some H atoms in the semiconductor layer 37 are desorbed from the semiconductor layer 37 during or after annealing, and are released as $H_2$ molecules from the semiconductor layer 37. Thus, the concentration of H atoms in the semiconductor layer 37 is lowered.

FIG. 10C illustrates the semiconductor layer 37 of this comparative example after the annealing in FIG. 8B. The semiconductor layer 37 of this comparative example changes from an amorphous semiconductor layer to a polycrystalline semiconductor layer by being annealed and cooled. H atoms, which are not desorbed from the semiconductor layer 37, re-bond to Si atoms in the semiconductor layer 37, or become $H_2$ molecules in the semiconductor layer 37. The latter H atoms ($H_2$ molecules) have a risk of forming voids in the semiconductor layer 37. Such voids are not desirable because they cause disconnection or high resistance of the semiconductor layer 37.

Here, P atoms in the semiconductor layer 37 of this comparative example will be described.

As illustrated in FIG. 10A, P atoms bond to Si atoms in the same manner as H atoms. Therefore, if the concentration of P atoms in the semiconductor layer 37 increases at the time of forming the semiconductor layer 37, the concentration of H atoms in the semiconductor layer 37 tends to decrease. This is because, when P atoms bond to Si atoms, the number of Si atoms that may bond to H atoms decreases, which makes it difficult for H atoms to bond to Si atoms. Although the semiconductor layer 37 of this comparative example contains P atoms, it has a low P atom concentration of less than $1.0 \times 10^{21}/cm^3$. Therefore, the semiconductor layer 37 of this comparative example has a high H atom concentration of more than $1.0 \times 10^{19}/cm^3$ before annealing. As a result, the concentration of H atoms in the semiconductor layer 37 of this comparative example is high even after annealing.

The concentration of P atoms in the semiconductor layer 37 of this comparative example may be increased by increasing the flow rate of the $PH_3$ gas when the semiconductor layer 37 is formed by the step of FIG. 7B. However, P atoms in the $PH_3$ gas enter the semiconductor layer 37 in the form of PH ions. Therefore, when the concentration of P atoms in the semiconductor layer 37 is increased by this method, the concentration of H atoms in the semiconductor layer 37 is also increased. Therefore, in this comparative example, the concentration of P atoms in the semiconductor layer 37 is set to be lower than $1.0 \times 10^{21}/cm^3$.

Figure 11A:
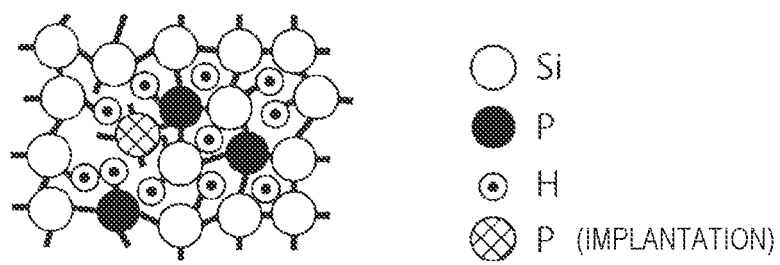
FIGS. 11A to 11C are schematic views illustrating the property of the semiconductor layer according to the first embodiment.
Figure 11B:
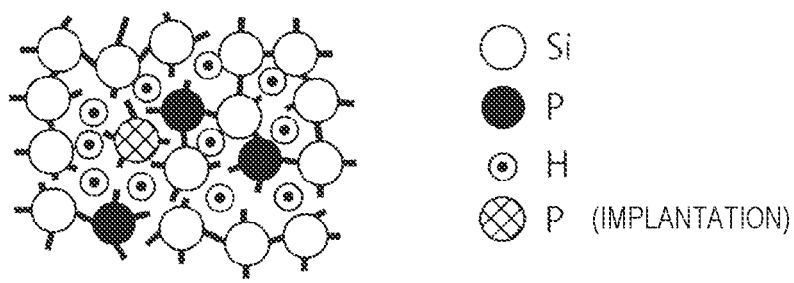
Figure 11C:
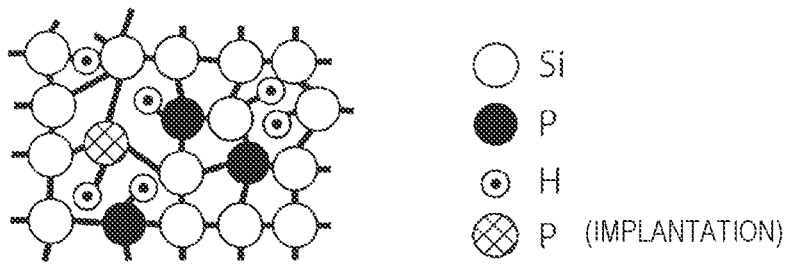

FIGS. 11A to 11C are schematic views illustrating the property of the semiconductor layer 37 according to the first embodiment.

FIG. 11A illustrates Si atoms, P atoms, and H atoms included in the semiconductor layer 37 of at least one embodiment. In at least one embodiment, the semiconductor layer 37 is formed by the step of FIG. 7B, and the P ion implantation illustrated in FIG. 8A is performed on the semiconductor layer 37. Accordingly, the semiconductor layer 37 of at least one embodiment contains P atoms having a concentration of $1.0 \times 10^{21}/cm^3$ or more and H atoms having a concentration higher than $1.0 \times 10^{19}/cm^3$ before the annealing in FIG. 8B. FIG. 11A illustrates P atoms introduced by the step of FIG. 7B and P atoms introduced by the step of FIG. 8A as being distinguished from each other. In FIG. 11A, the former P atoms or H atoms bond to Si atoms to enter the crystal lattice, and the latter P atoms enter the crystal lattice without bonding to Si atoms.

FIG. 11B illustrates the semiconductor layer 37 of at least one embodiment during the annealing in FIG. 8B. This annealing breaks bonds between Si atoms, P atoms, and H atoms. As a result, some H atoms in the semiconductor layer 37 are desorbed from the semiconductor layer 37 during or after annealing, and are released as $H_2$ molecules from the semiconductor layer 37. Thus, the concentration of H atoms in the semiconductor layer 37 is lowered.

FIG. 11C illustrates the semiconductor layer 37 of at least one embodiment after the annealing in FIG. 8B. The semiconductor layer 37 of at least one embodiment changes from an amorphous semiconductor layer to a polycrystalline semiconductor layer by being annealed and cooled. H atoms, which are not desorbed from the semiconductor layer 37, re-bond to Si atoms in the semiconductor layer 37, or become $H_2$ molecules in the semiconductor layer 37. The latter H atoms ($H_2$ molecules) have a risk of forming voids in the semiconductor layer 37. Such voids are not desirable because they cause disconnection or high resistance of the semiconductor layer 37. In FIG. 11C, P atoms introduced by the P ion implantation also bond to Si atoms in the semiconductor layer 37.

Here, P atoms in the semiconductor layer 37 of at least one embodiment will be described.

The semiconductor layer 37 of at least one embodiment has a high P atom concentration of $1.0 \times 10^{21}/cm^3$ or more before annealing. In at least one embodiment, such a high P atom concentration is realized not only by the introduction of P atoms in the step of FIG. 7B but also by the introduction of P atoms in the steps of FIGS. 7B and 8A. This makes it possible to increase the P atom concentration before annealing while limiting the H atom concentration before annealing to the same extent as in the case of the comparative example.

After the annealing of the semiconductor layer 37 of at least one embodiment, Si atoms bond not only to P atoms introduced by the step of FIG. 7B but also to P atoms introduced by the step of FIG. 8A. As a result, H atoms are easily desorbed from the semiconductor layer 37, and the concentration of H atoms in the semiconductor layer 37 is greatly reduced. This makes it possible to reduce the concentration of H atoms in the semiconductor layer 37 to a low concentration of $1.0 \times 10^{19}/cm^3$ or less, and to prevent the generation of voids in the semiconductor layer 37.

Figure 12A:
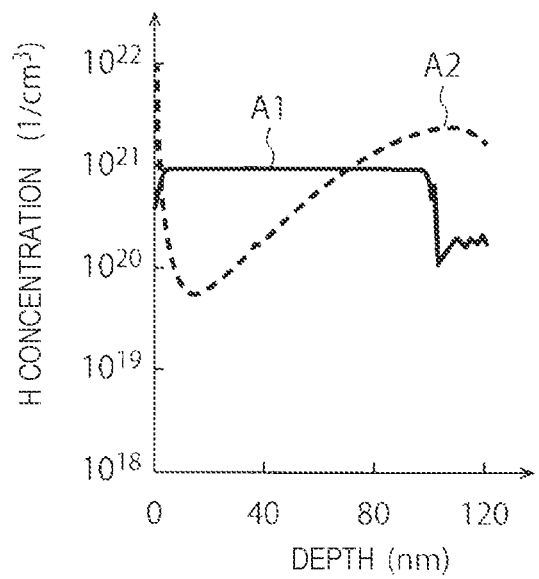
FIGS. 12A and 12B are graphs illustrating the property of the semiconductor layer according to the comparative example of the first embodiment.
Figure 12B:
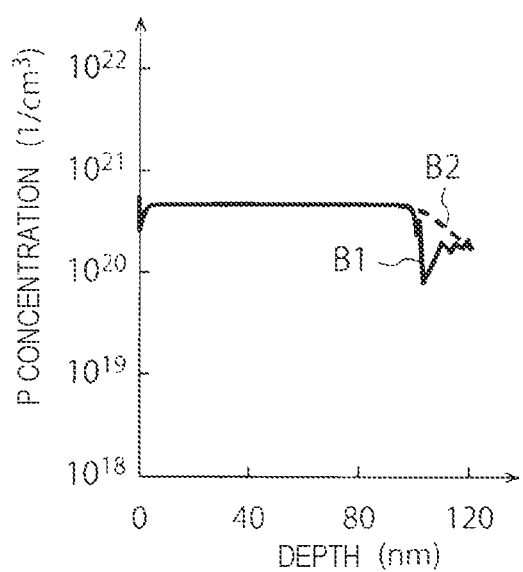

FIGS. 12A and 12B are graphs illustrating the property of the semiconductor layer 37 according to the comparative example of the first embodiment.

FIG. 12A illustrates the H atom concentration at each location in the semiconductor layer 37 of this comparative example. The horizontal axis of FIG. 12A indicates the depth at each location in the semiconductor layer 37, i.e., the distance in the Z direction from the upper surface of the semiconductor layer 37 to each location in the semiconductor layer 37. The vertical axis of FIG. 12A indicates the H atom concentration at each location in the semiconductor layer 37. Thus, FIG. 12A illustrates the concentration profile of H atoms in the semiconductor layer 37 of this comparative example.

In FIG. 12A, a curve A1 indicates the H atom concentration when the semiconductor layer 37 is formed in the step of FIG. 7B, and a curve A2 indicates the H atom concentration after the semiconductor layer is annealed in FIG. 8B. According to the curve A2, the concentration of H atoms in the semiconductor layer 37 increases near the depth of 100 nm. It is considered that this is because voids were generated near the depth of 100 nm in the semiconductor layer 37.

FIG. 12B illustrates the P atom concentration at each location in the semiconductor layer 37 of this comparative example. FIG. 12B illustrates the concentration profile of P atoms in the semiconductor layer 37 of this comparative example, similarly to FIG. 12A.

In FIG. 12B, a curve B1 indicates the P atom concentration when the semiconductor layer 37 is formed in the step of FIG. 7B, and a curve B2 indicates the P atom concentration after the semiconductor layer 37 is annealed in FIG. 8B. The concentration of P atoms in the semiconductor layer 37 of this comparative example is lower than $1.0 \times 10^{21}/cm^3$ at any depth.

Figure 13A:
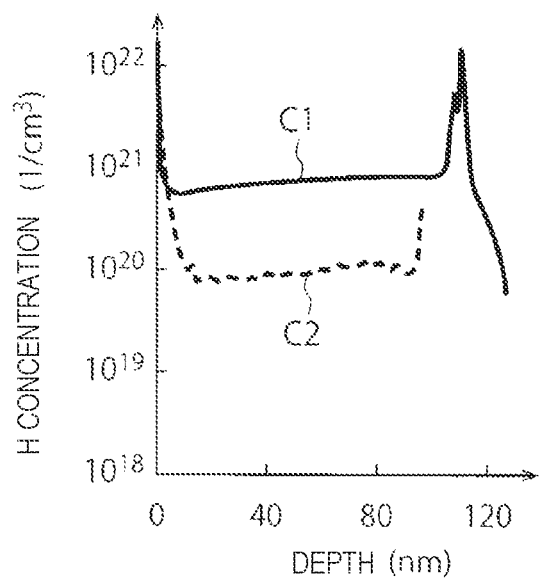
FIGS. 13A and 13B are graphs illustrating the property of the semiconductor layer according to the first embodiment.
Figure 13B:
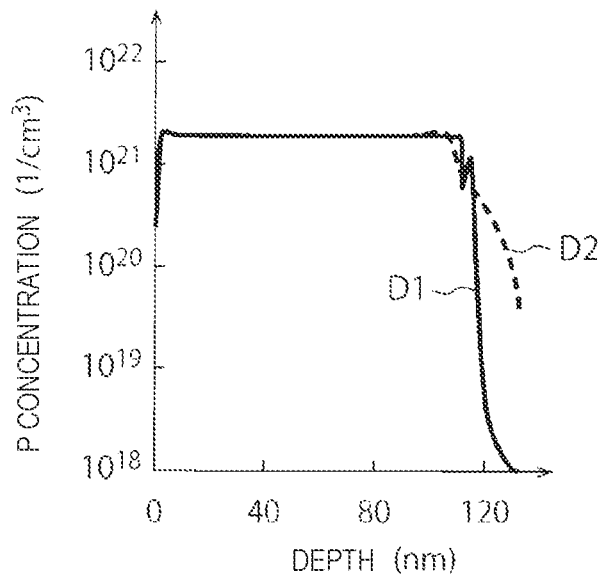

FIGS. 13A and 13B are graphs illustrating the property of the semiconductor layer 37 according to the first embodiment.

FIG. 13A illustrates the H atom concentration at each location in the semiconductor layer 37 of at least one embodiment. FIG. 13A illustrates the concentration profile of H atoms in the semiconductor layer 37 of at least one embodiment, similarly to FIGS. 12A and 12B.

In FIG. 13A, a curve C1 indicates the H atom concentration when the semiconductor layer 37 is formed in the step of FIG. 7B, and a curve C2 indicates the H atom concentration after the semiconductor layer 37 is annealed in FIG. 8B. The H atom concentration indicated by the curve C2 is generally lower than the H atom concentration indicated by the curve C1 at any depth. It is considered that this is because the P ion implantation illustrated in FIG. 8A was performed on the semiconductor layer 37.

FIG. 13B illustrates the H atom concentration at each location in the semiconductor layer 37 of the present embodiment. FIG. 13B illustrates the concentration profile of P atoms in the semiconductor layer 37 of this comparative example, similarly to FIGS. 12A to 13A.

In FIG. 13B, a curve D1 indicates the P atom concentration when the semiconductor layer 37 is formed in the step of FIG. 7B, and a curve D2 indicates the P atom concentration after the semiconductor layer 37 is annealed in FIG. 8B. The concentration of P atoms in the semiconductor layer 37 of this comparative example is generally $1.0\times10^{21}$/cm3 or more at any depth within 120 nm.

As described above, in at least one embodiment, the semiconductor layer 37 containing P atoms and H atoms is formed, and thereafter, P atoms are further implanted into the semiconductor layer 37. Accordingly, according to at least one embodiment, it is possible to sufficiently reduce the concentration of H atoms in the semiconductor layer 37 by subsequent annealing. According to at least one embodiment, it is possible to form the semiconductor layer 37 containing P atoms having an atomic concentration of $1.0\times10^{21}$/cm$^3$ or more and H atoms having an atomic concentration of $1.0\times10^{19}$/cm$^3$ or less. Further, according to at least one embodiment, the semiconductor layer 37 may be an n-type semiconductor layer by realizing the desorption of H atoms via the introduction of P atoms.

Second Embodiment

FIGS. 14A to 15B are cross-sectional views illustrating the method of manufacturing the semiconductor device according to a second embodiment.

Figure 14A:
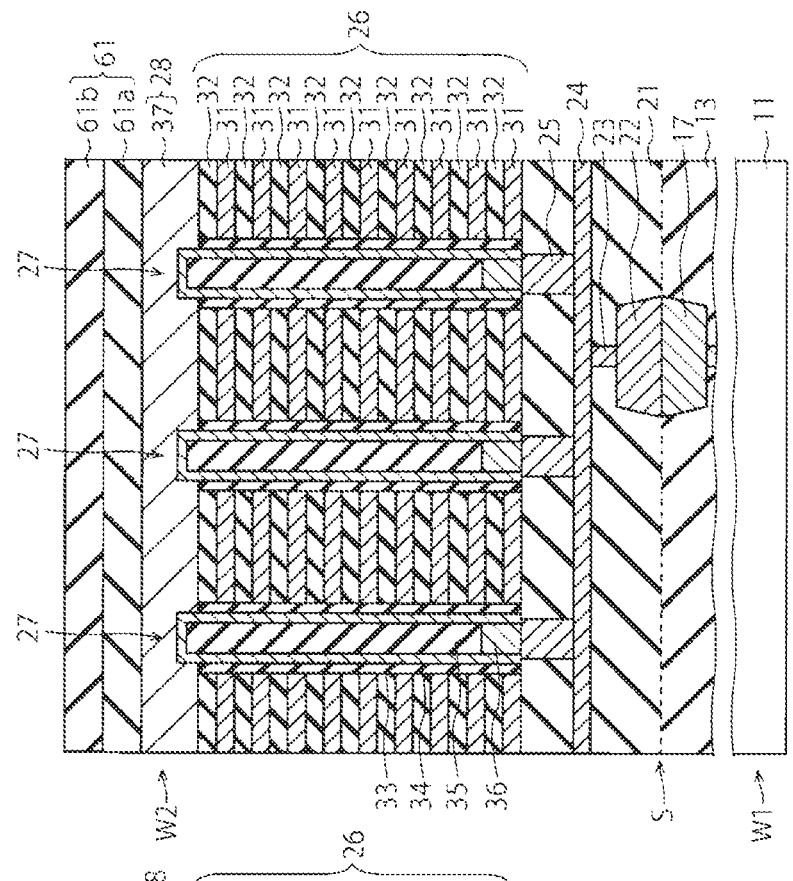
FIGS. 14A and 14B are cross-sectional views (1/2) illustrating the method of manufacturing the semiconductor device according to a second embodiment.

FIG. 14A illustrates P ion implantation into the semiconductor layer 37 in the same manner as FIG. 8A. The method of manufacturing the semiconductor device of at least one embodiment is performed in the same manner as the method of manufacturing the semiconductor device of the first embodiment from the step of FIG. 4A to the step of FIG. 8A. The semiconductor layer 37 illustrated in FIG. 14A contains, for example, P atoms having a concentration of $1.0\times10^{21}$/cm$^3$ or more and H atoms having a concentration higher than $1.0\times10^{19}$/cm$^3$.

Figure 14B:
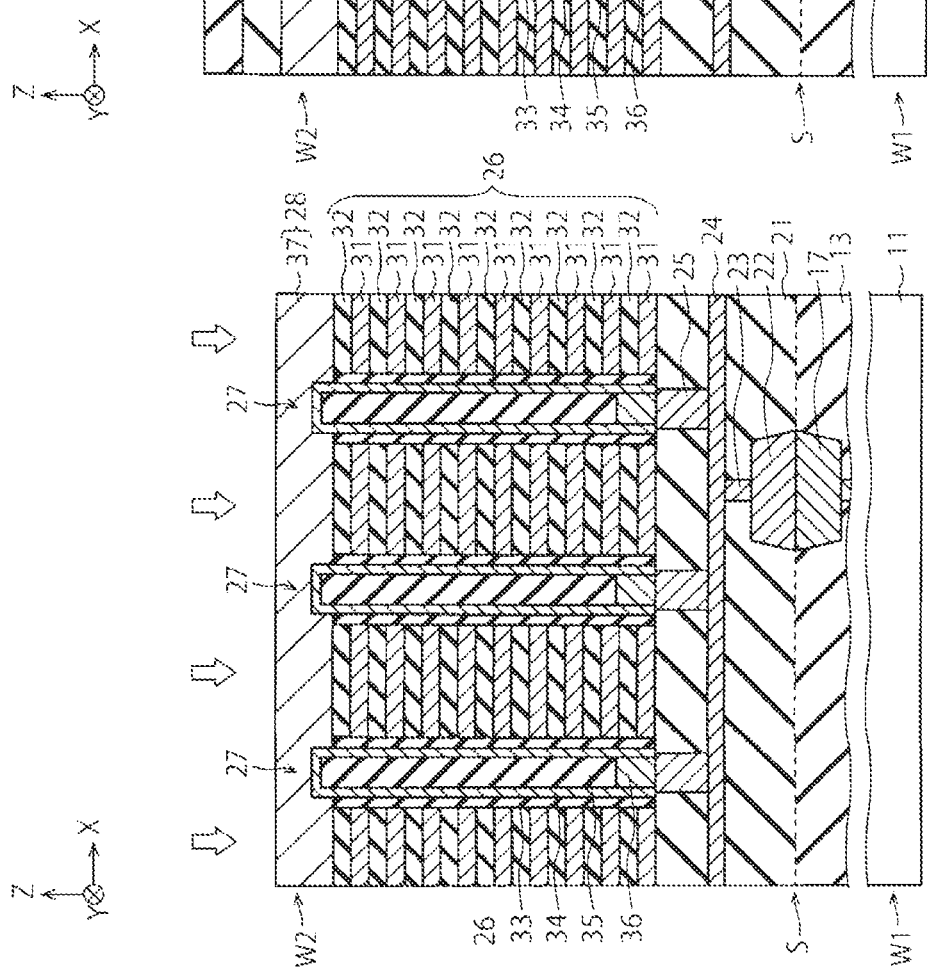

Next, a lower film 61a is formed on the semiconductor layer 37, and an upper film 61b is formed on the lower film 61a (FIG. 14B). As a result, a cap layer 61 including the lower film 61a and the upper film 61b is formed on the semiconductor layer 37. The lower film 61a is, for example, a SiO$_2$ film. The upper film 61b is, for example, a SiN film. The cap layer 61 is an example of a first layer. The lower film 61a and the upper film 61b are examples of a first film and a second film, respectively.

Next, the semiconductor layer 37 is annealed (FIG. 14B). This annealing is performed in the same manner as the annealing in FIG. 8B. As a result, the semiconductor layer 37 is crystallized, and changes from an amorphous semiconductor layer to a polycrystalline semiconductor layer.

During this annealing, at least a part of H atoms in the semiconductor layer are desorbed from the semiconductor layer 37, and the concentration of H atoms in the semiconductor layer 37 is lowered. This annealing is performed such that the concentration of H atoms in the semiconductor layer 37 is, for example, $1.0\times10^{19}$/cm$^3$ or less. According to at least one embodiment, by sufficiently promoting the desorption of H atoms from the semiconductor layer 37 by the high concentration of P atoms, it is possible to reduce the H atom concentration to a low concentration as described above.

Figure 15A:
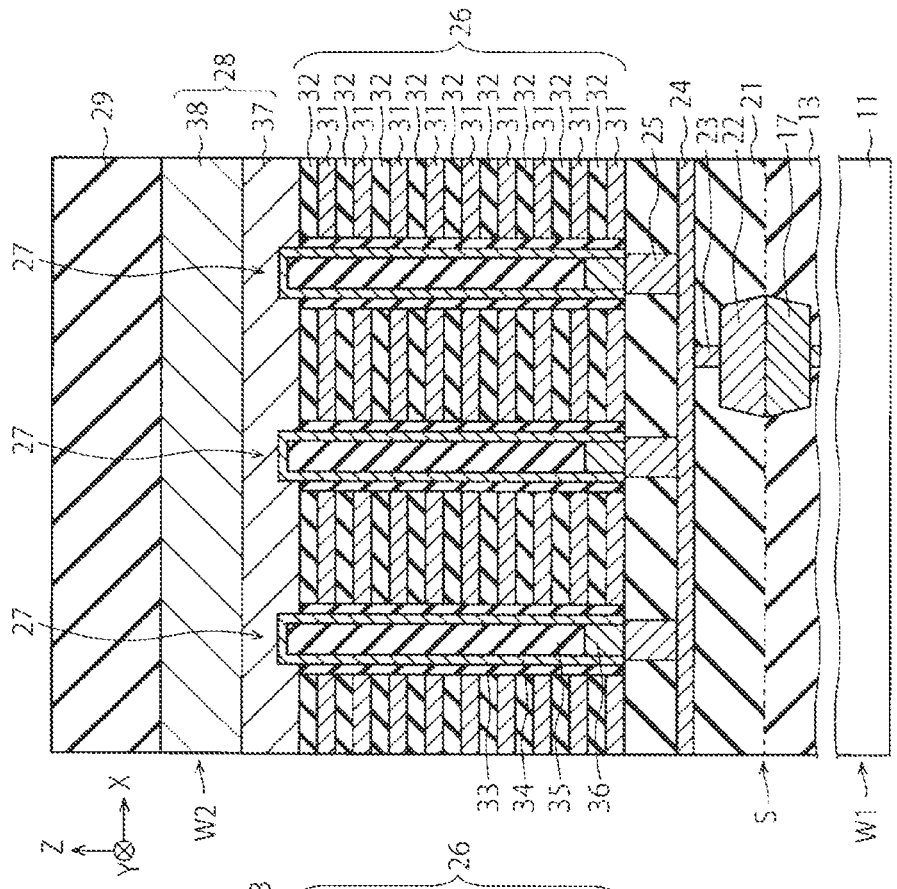
FIGS. 15A and 15B are cross-sectional views (2/2) illustrating the method of manufacturing the semiconductor device according to the second embodiment.
Figure 15B:
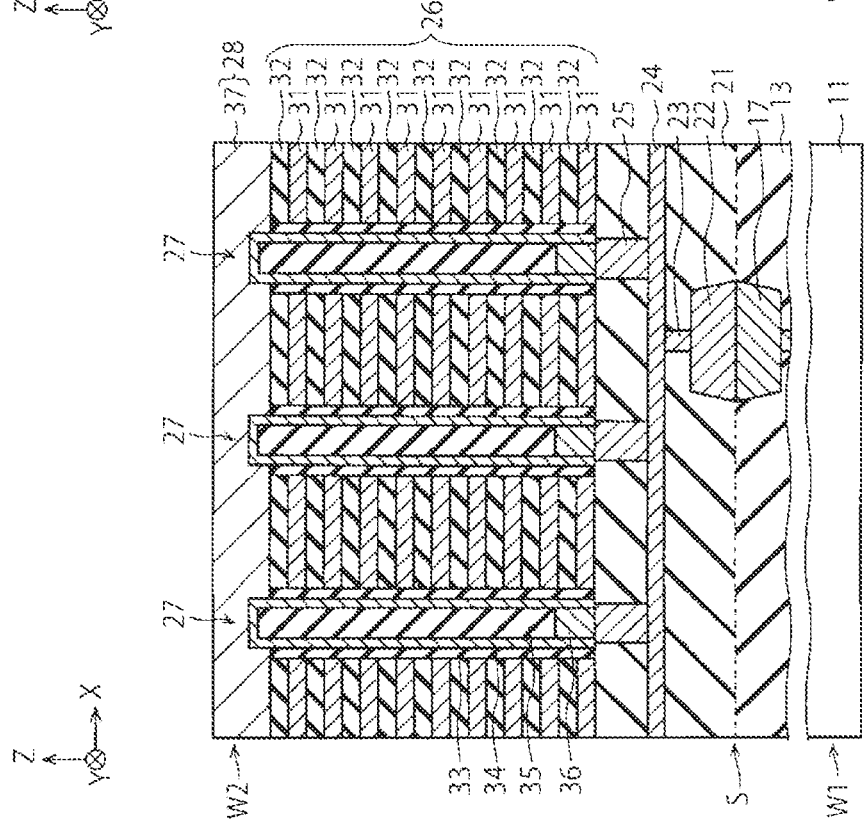

Next, the cap layer 61 is removed from the upper surface of the semiconductor layer 37 (FIG. 15A). Next, the metal layer 38 of the source layer 28 is formed on the semiconductor layer 37, and the insulating film 29 is formed on the metal layer 38 (FIG. 15B).

Thereafter, the circuit wafer W1 and the array wafer W2 are cut into a plurality of chips. These chips are cut such that each chip includes the circuit region 1 and the array region 2. In this way, the semiconductor device of FIG. 1 is manufactured.

Figure 16A:
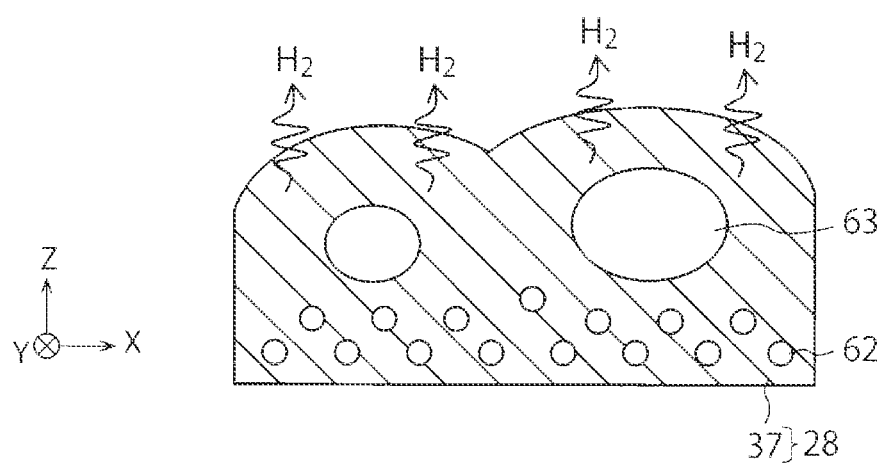
FIGS. 16A and 16B are cross-sectional views illustrating the property of the semiconductor layer according to the second embodiment.
Figure 16B:
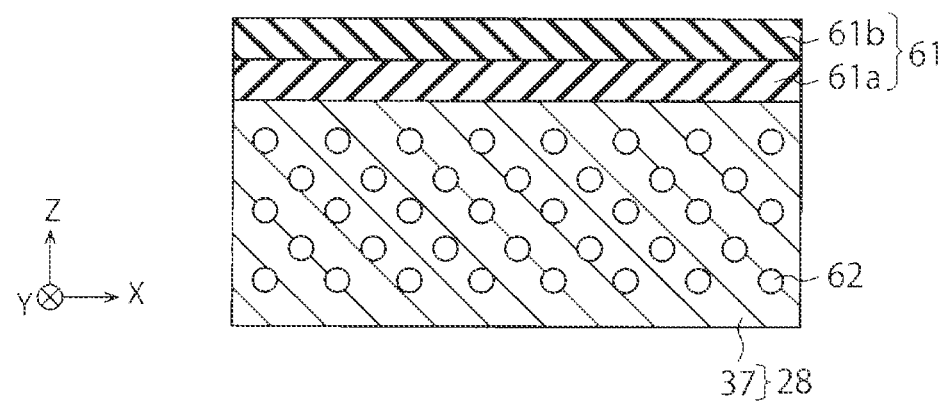

FIGS. 16A and 16B are cross-sectional views illustrating the property of the semiconductor layer 37 according to the second embodiment.

FIG. 16A illustrates a comparative example of the present embodiment in which the annealing in FIG. 14B is performed in a state where the cap layer 61 is not provided on the semiconductor layer 37. In this annealing, the semiconductor layer 37 is melted. Therefore, there is a risk of irregularities being generated on the upper surface of the semiconductor layer 37 after the semiconductor layer 37 is cooled. This is because the upper surface of the semiconductor layer 37 is not pressed by the cap layer 61. Further, since the upper surface of the semiconductor layer 37 is not pressed by the cap layer 61, as illustrated in FIG. 16A, bubbles 62 of H$_2$ gas in the semiconductor layer 37 tend to become voids 63.

FIG. 16B illustrates that the annealing in FIG. 14B is performed in a state where the cap layer 61 is provided on the semiconductor layer 37 as in at least one embodiment. In this case, since the upper surface of the semiconductor layer 37 is pressed by the cap layer 61, it is possible to prevent the generation of irregularities on the upper surface of the semiconductor layer 37 even if the semiconductor layer 37 is melted and cooled. Further, even if the bubbles 62 tend to become the voids 63, it is possible to prevent the generation of the voids 63 since the growth of the voids 63 is inhibited by the cap layer 61.

The cap layer 61 may be formed on the semiconductor layer 37 before the implantation of P ions into the semiconductor layer 37. However, forming the cap layer 61 after the implantation of P ions into the semiconductor layer 37 has an advantage of P ions being easily implanted into the semiconductor layer 37.

Third Embodiment

Figure 17:
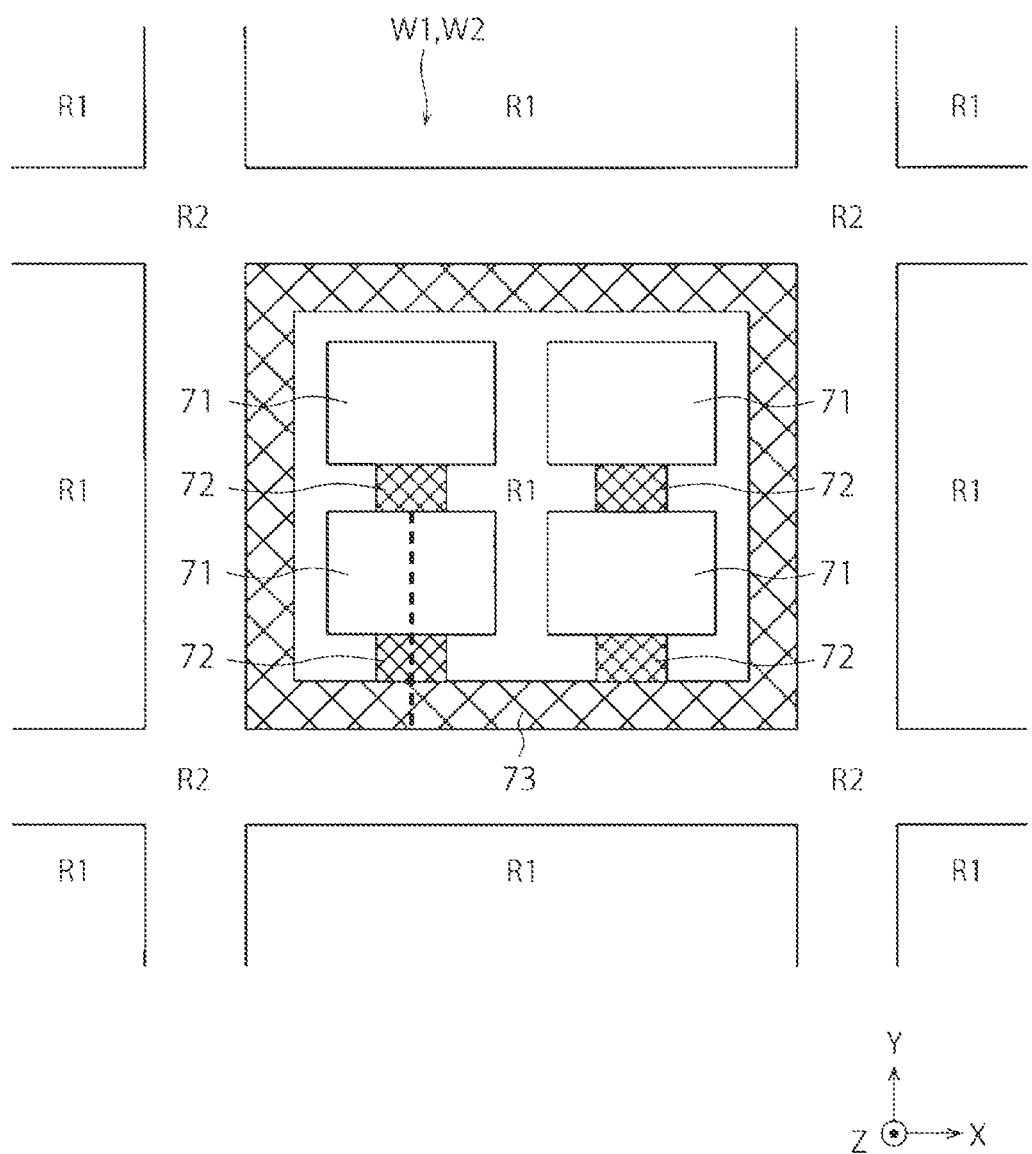
FIG. 17 is a plan view illustrating the method of manufacturing the semiconductor device according to a third embodiment.

FIG. 17 is a plan view illustrating the method of manufacturing the semiconductor device according to a third embodiment.

The semiconductor device of at least one embodiment is manufactured by the steps of FIGS. 4A to 8B in the same manner as the semiconductor device of the first embodiment. FIG. 17 illustrates a planar structure of the circuit wafer W1 and the array wafer W2 after the step of FIG. 8B is completed and before the wafers are cut into a plurality of chips.

The circuit wafer W1 and the array wafer W2 of at least one embodiment include a plurality of device regions R1 and a dicing region R2 which individually surrounds the device regions R1. Each device region R1 becomes one semiconductor device (one chip) after the above-described cutting. Each device region R1 includes one circuit region 1 and one array region 2 (see FIG. 1). The dicing region R2 is a region to which a dicer is applied at the time of the above cutting. The dicing region R2 is also called a scribe region or a calf region.

Each device region R1 includes a plurality of memory portions 71, a plurality of calf cut portions 72, and an edge seal portion 73. Each memory portion 71 includes the memory cell array 41 or the transistor 12 (see FIG. 3). Each calf cut portion 72 is provided adjacent to the corresponding memory portion 71. The edge seal portion 73 is provided along four sides (edges) of each device region R1, and has the shape of a ring-shaped plane surrounding the memory portion 71 and the calf cut portion 72. The edge seal portion 73 includes, for example, a guard ring for sealing each device region R1.

Figure 18:
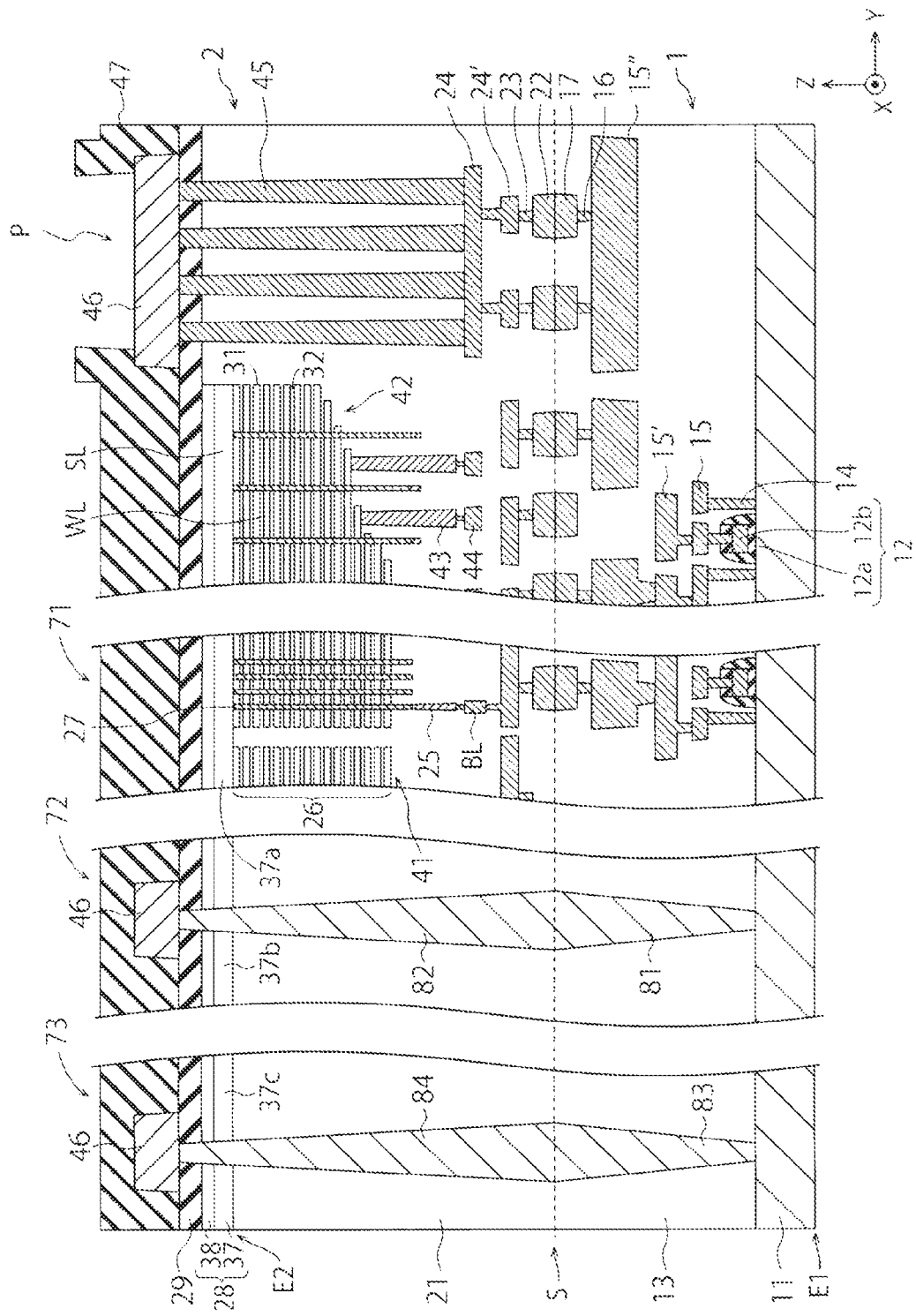
FIG. 18 is a cross-sectional view illustrating the overall structure of the semiconductor device according to the third embodiment.

FIG. 18 is a cross-sectional view illustrating the overall structure of the semiconductor device according to the third embodiment.

FIG. 18 illustrates the cross section of the semiconductor device after manufacture (after completion) along the line L illustrated in FIG. 17. Therefore, FIG. 18 illustrates the cross section of one memory portion 71, one calf cut portion 72, and one edge seal portion 73. The memory portion 71 illustrated in FIG. 18 has the same structure as that illustrated in FIG. 3.

The calf cut portion 72 includes a metal portion 81 provided in the circuit region 1 and a metal portion 82 provided in the array region 2. The metal portion 81 is provided on the substrate 11 and penetrates the interlayer insulating film 13. The metal portion 82 is provided on the metal portion 81, and penetrates the interlayer insulating film 21, the source layer 28, and the insulating film 29. The calf cut portion 72 also has the metal pad 46 provided on the metal portion 82 and covered with the passivation film 47.

The edge seal portion 73 includes a metal portion 83 provided in the circuit region 1 and a metal portion 84 provided in the array region 2. The metal portion 83 is provided on the substrate 11 and penetrates the interlayer insulating film 13. The metal portion 84 is provided on the metal portion 83 and penetrates the interlayer insulating film 21, the source layer 28, and the insulating film 29. The edge seal portion 73 further has the metal pad 46 provided on the metal portion 84 and covered with the passivation film 47. The metal portion 83, the metal portion 84, and the metal pad 46 in the edge seal portion 73 form, for example, a guard ring.

The metal portions 81 and 83 are formed of, for example, the same material as the contact plug 14, the wiring layer 15, the wiring layer 15', the wiring layer 15", the via plug 16, and the metal pad 17. Further, the metal portions 82 and 84 are formed of, for example, the same material as the metal pad 22, the via plug 23, the wiring layer 24', the wiring layer 24, and the via plug 45.

The semiconductor layer 37 of at least one embodiment includes a region 37a provided in the memory portion 71, a region 37b provided in the calf cut portion 72, and a region 37c provided in the edge seal portion 73. The region 37a is an example of a first region. The regions 37b and 37c are an example of a second region.

Hereinafter, two examples of the semiconductor layer 37 of at least one embodiment will be described.

In a first example, all of the regions 37a, 37b and 37c are polycrystalline semiconductor layers such as polysilicon layers, and contain P atoms having an atomic concentration of $1.0 \times 10^{21}/cm^3$ or more and H atoms having an atomic concentration of $1.0 \times 10^{19}/cm^3$ or less. Such a semiconductor layer 37 may be formed, for example, by implanting P ions into the entire semiconductor layer 37 in the step of FIG. 8A and annealing the entire semiconductor layer 37 in the step of FIG. 8B. The first example has an advantage in that it is not necessary to distinguish between a region where ion implantation and annealing are performed and a region where ion implantation and annealing are not performed.

In a second example, the region 37a is a polycrystalline semiconductor layer such as a polysilicon layer, and contains P atoms having an atomic concentration of $1.0 \times 10^{21}/cm^3$ or more and H atoms having an atomic concentration of $1.0 \times 10^{19}/cm^3$ or less. Meanwhile, the regions 37b and 37c are amorphous semiconductor layers such as amorphous silicon layers, and contain H atoms having an atomic concentration higher than $1.0 \times 10^{19}/cm^3$. Such a semiconductor layer 37 may be formed, for example, by implanting P ions into the entire semiconductor layer 37 or only the region 37a in the step of FIG. 8A and annealing only the region 37a in the step of FIG. 8B. When P ions are implanted into the entire semiconductor layer 37, the concentration of P atoms in the regions 37b and 37c is $1.0 \times 10^{21}/cm^3$ or more. Meanwhile, when P ions are implanted only into the region 37a, the concentration of P atoms in the regions 37b and 37c is lower than $1.0 \times 10^{21}/cm^3$. In the second example, by limiting a region where ion implantation and annealing are performed to the region 37a, it is possible to avoid unnecessary ion implantation and annealing for the regions 37b and 37c.

In the first and second examples, the semiconductor layer in a region where annealing is performed changes from an amorphous semiconductor layer to a polycrystalline semiconductor layer in the step of FIG. 8B, and the semiconductor layer 37 in a region where annealing is not performed is maintained in an amorphous semiconductor layer in the step of FIG. 8B. In the first and second examples, P ions may be implanted in advance into the region where annealing is performed but may not be implanted in advance into the region where annealing is not performed. These regions may be set to shapes different from the first and second examples. For example, ion implantation and annealing may be performed only on the regions 37a and 37b in the semiconductor layer 37.

FIG. 18 illustrates an end surface E1 of the substrate 11 and a side surface E2 of the semiconductor layer 37 positioned above the end surface E1. The end surface E1 and the side surface E2 are provided in the edge seal portion 73, and the side surface E2 corresponds to the side surface of the region 37c. The end surface E1 and the side surface E2 are located at the boundary between the device region R1 and the dicing region R2 in FIG. 17.

In the first example, the semiconductor layer 37 is a polycrystalline semiconductor layer in the side surface E2, and contains P atoms having an atomic concentration of $1.0 \times 10^{21}/cm^3$ or more, and H atoms having an atomic concentration of $1.0 \times 10^{19}/cm^3$ or less. In the second example, the semiconductor layer 37 is an amorphous semiconductor layer in the side surface E2, and contains H atoms having an atomic concentration higher than $1.0 \times 10^{19}/cm^3$. The semiconductor layer 37 may be a polycrystalline semiconductor layer in a portion of the side surface E2, and may be an amorphous semiconductor layer in another portion of the side surface E2.

As described above, the semiconductor layer 37 of at least one embodiment may include only a polycrystalline semiconductor layer, or may include a polycrystalline semiconductor layer and an amorphous semiconductor layer. Further, the semiconductor layer 37 of at least one embodiment may have a different P atom concentration and H atom concentration for each region.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a stacked film including a plurality of electrode layers and a plurality of insulating layers alternately stacked in a first direction;
   a columnar portion including a charge storage layer and a first semiconductor layer, the columnar portion extending in the first direction in the stacked film; and
   a second semiconductor layer disposed on the stacked film and the columnar portion,
   wherein at least a part of regions in the second semiconductor layer contains phosphorus having an atomic concentration of $1.0\times10^{21}/cm^3$ or more and hydrogen having an atomic concentration of $1.0\times10^{19}/cm^3$ or less.

2. The semiconductor device according to claim 1, wherein the at least a part of regions in the second semiconductor layer is a polycrystalline semiconductor layer.

3. The semiconductor device according to claim 1, wherein the second semiconductor layer includes a first region that is a polycrystalline semiconductor layer and a second region that is an amorphous semiconductor layer.

4. The semiconductor device according to claim 3, wherein an atomic concentration of phosphorus in the first region is $1.0\times10^{21}/cm^3$ or more, and an atomic concentration of hydrogen in the first region is $1.0\times10^{19}/cm^3$ or less.

5. The semiconductor device according to claim 3, wherein an atomic concentration of hydrogen in the second region is higher than $1.0\times10^{19}/cm^3$.

6. The semiconductor device according to claim 1, wherein
   the plurality of electrode layers and the plurality of insulating layers are alternately disposed on a first substrate, and
   an atomic concentration of hydrogen in the second semiconductor layer is $1.0\times10^{19}/cm^3$ or less in at least a portion of a side surface of the second semiconductor layer positioned above an end surface of the first substrate.

7. The semiconductor device according to claim 6, wherein the at least a portion of the side surface of the second semiconductor layer is a polycrystalline semiconductor layer.

8. The semiconductor device according to claim 1, wherein
   the plurality of electrode layers and the plurality of insulating layers are alternately disposed on a first substrate, and
   an atomic concentration of hydrogen in the second semiconductor layer is higher than $1.0\times10^{19}/cm^3$ in at least a portion of a side surface of the second semiconductor layer positioned above an end surface of the first substrate.

9. The semiconductor device according to claim 8, wherein the at least a portion of the side surface of the second semiconductor layer is an amorphous semiconductor layer.

10. The semiconductor device according to claim 1, further comprising:
    a first substrate;
    a first pad disposed above the first substrate; and
    a second pad disposed on the first pad,
    wherein the first semiconductor layer is disposed at a position higher than the second pad and is electrically connected to the second pad.

11. The semiconductor device according to claim 1, wherein the plurality of electrode layers is a plurality of word lines, and the second semiconductor layer is a source line.

* * * * *